US012575185B2

(12) United States Patent
Sharma

(10) Patent No.: US 12,575,185 B2
(45) Date of Patent: Mar. 10, 2026

(54) JUNCTION FIELD EFFECT TRANSISTORS FOR LOW VOLTAGE AND LOW TEMPERATURE OPERATION

(71) Applicant: Intel Corporation, Santa Clara, CA (US)

(72) Inventor: Abhishek Sharma, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 754 days.

(21) Appl. No.: 17/711,854

(22) Filed: Apr. 1, 2022

(65) Prior Publication Data

US 2023/0317718 A1    Oct. 5, 2023

(51) Int. Cl.
| | |
|---|---|
| *H10D 88/00* | (2025.01) |
| *H01L 23/528* | (2006.01) |
| *H10D 30/62* | (2025.01) |
| *H10D 62/815* | (2025.01) |
| *H10D 62/824* | (2025.01) |
| *H10D 64/62* | (2025.01) |
| *H10D 64/68* | (2025.01) |
| *H10D 84/03* | (2025.01) |

(52) U.S. Cl.
CPC ......... *H10D 88/101* (2025.01); *H01L 23/528* (2013.01); *H10D 30/6211* (2025.01); *H10D 62/8164* (2025.01); *H10D 62/824* (2025.01); *H10D 64/62* (2025.01); *H10D 64/691* (2025.01); *H10D 84/038* (2025.01); *H10D 88/01* (2025.01)

(58) Field of Classification Search
CPC ............. H10D 88/101; H10D 30/6211; H10D 64/691; H10D 62/824; H10D 62/8164; H10D 64/62; H10D 88/01; H10D 84/038
See application file for complete search history.

(56) References Cited

U.S. PATENT DOCUMENTS

| | | | |
|---|---|---|---|
| 2018/0269658 A1* | 9/2018 | Crowley | .............. H01S 5/3434 |
| 2023/0178641 A1* | 6/2023 | Cha | ...................... H10D 64/205 |
| | | | 257/280 |

OTHER PUBLICATIONS

Wen, F., et al., "Epitaxial Al-InAs Heterostructures as Platform for Josephson Junction Field-Effect Transistor Logic Devices", IEEE Transactions on Electron Devices; vo. 68, No. 4; Apr. 2021.
O'Connell, Joseph, et al., "Epitaxial Superconductor-Semiconductor Two-Dimensional Systems for Superconducting Quantum Circuits", Center for Quantum Phenomena, Department of Physics, Apr. 5, 2021, , 9 pgs.

* cited by examiner

*Primary Examiner* — Christine A Enad

(74) *Attorney, Agent, or Firm* — Essential Patents Group, LLP

(57) ABSTRACT

Integrated circuit dies, systems, and techniques, are described herein related to junction field effect transistors operable at low temperatures and low voltages. A system includes an integrated circuit die deploying a junction field effect transistor that includes a source, a drain, and a gate structure coupled to a multi-layer quantum well. The source and drain are indium arsenide and the gate structure includes a high-k gate dielectric material. The system further includes a cooling structure integral to the integrated circuit die, coupled to the integrated circuit die, or both. The cooling structure is operable to remove heat from the integrated circuit die to achieve a low operating temperature of the integrated circuit die.

25 Claims, 19 Drawing Sheets

100

114

115

116

117

147

800

1000

163
901
902
162
168
802
801
M12
803
153
152
M11
M10
154
M9
M8
164
M7
M6
M5
M4/V3
M3/V2
M2/V1
M1
V0
M0
C1
C0
139
120
133
BM0
BM1
151
154
BM2
MIM
153
BM3
165
155
166
Bump

Z
Y     X

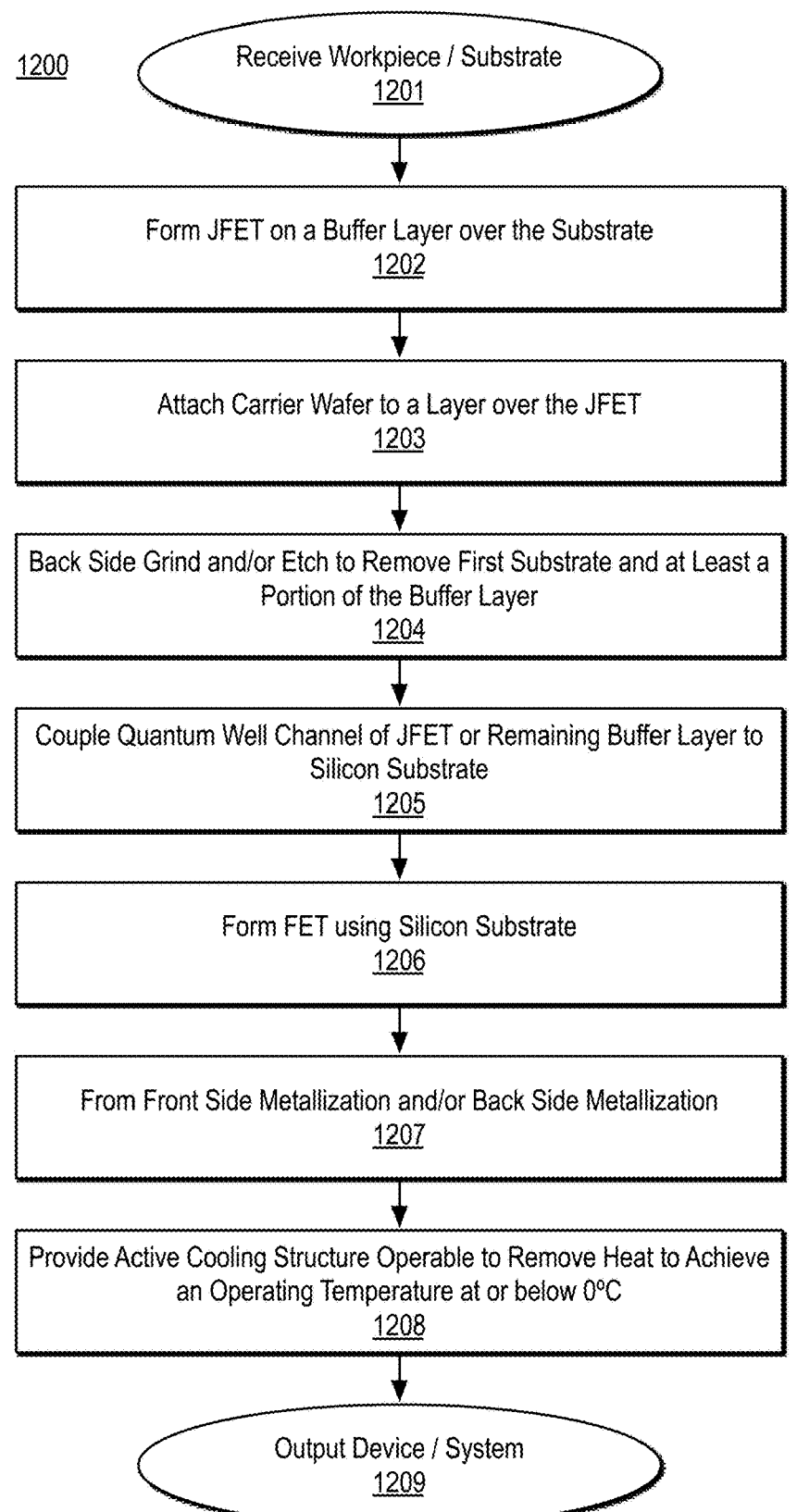

1200

Receive Workpiece / Substrate
1201

Form JFET on a Buffer Layer over the Substrate
1202

Attach Carrier Wafer to a Layer over the JFET
1203

Back Side Grind and/or Etch to Remove First Substrate and at Least a Portion of the Buffer Layer
1204

Couple Quantum Well Channel of JFET or Remaining Buffer Layer to Silicon Substrate
1205

Form FET using Silicon Substrate
1206

From Front Side Metallization and/or Back Side Metallization
1207

Provide Active Cooling Structure Operable to Remove Heat to Achieve an Operating Temperature at or below 0°C
1208

Output Device / System
1209

FIG. 12

JUNCTION FIELD EFFECT TRANSISTORS FOR LOW VOLTAGE AND LOW TEMPERATURE OPERATION

BACKGROUND

There is an ongoing need for improved computational devices to enable ever increasing demand for modeling complex systems, providing reduced computation times, and other considerations. In some contexts, scaling features of integrated circuits has been a driving force for such improvements. Other advancements have been made in materials, device structure, circuit layout, and so on. Notably, there is a desire in some contexts to operate devices at very low voltages. Junction field effect transistors (JFETs) provide a three-terminal device for use in a variety of circuit implementations. For example, JFETs may be used as switches. However, typical JFETs may not be operable at very low voltages. Current JFET devices have other disadvantages including poor $I_{ON}/I_{OFF}$ behavior.

It is with respect to these and other considerations that the present improvements have been needed. Such improvements may become critical as the desire to improve computational efficiency become even more widespread.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIG. 12 is a flow diagram illustrating an example process for forming a low temperature integrated junction field effect transistor and fin field effect transistor integrated circuit system;

DETAILED DESCRIPTION

Figure 1A:
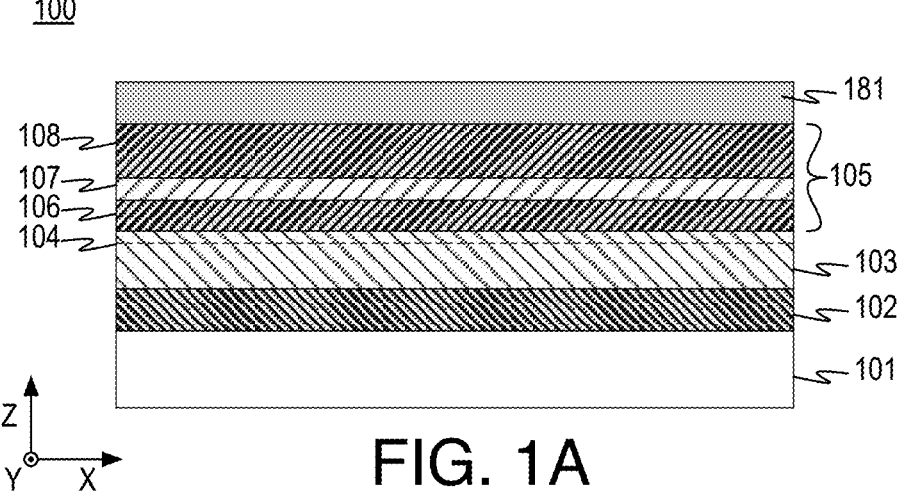
FIGS. 1A, 1B, 1C, 1D, 1E, 1F, 1G, 1H, 1I, and 1J illustrate cross-sectional views of junction field effect transistors as fabrication operations are performed, and integration of the junction field effect transistors with complementary metal oxide semiconductor field effect transistors.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized, and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship, an electrical relationship, a functional relationship, etc.).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features. The term immediately adjacent indicates such features are in direct contact. Furthermore, the terms "substantially," "close," "approximately," "near," and "about," generally refer to being within +/−10% of a target value. The term layer as used herein may include a single material or multiple materials. As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. The terms "lateral", "laterally adjacent" and similar terms indicate two or more components are aligned along a plane orthogonal to a vertical direction of an overall structure. As used herein, the term predominantly indicates the predominant constituent (i.e., greater than 50% is the constituent of greatest proportion in the layer or material). The term substantially pure indicates the constituent is not less than 99% of the material. The term pure indicates the constituent is not less than 99.5% of the material and the term completely pure indicates the constituent is not less than 99.9% of the material. As used herein, the terms "monolithic", "monolithically integrated", and similar terms indicate the components of the monolithic overall structure form an indivisible whole not reasonably capable of being separated.

Integrated circuit dies, systems, circuits, and techniques are described herein related to junction field effect transistors (JFETs) for ultra low voltage operation. Such JFETs may be operable at very low temperatures for improved device performance and/or they may be integrated with complementary metal oxide semiconductor field effect transistors (CMOS FETs) such as FinFETs.

Techniques discussed herein provide advantageous JFETs for low voltage applications. In some embodiments, such applications are deployed at very low temperatures, such as, at or below 0° C. For example, the JFETs may be deployed in an integrated circuit (IC) die including or coupled to cooling structure operable to remove heat from the IC die to achieve an operating temperature at the very low temperature. As used herein, the term cooling structure or active cooling structure indicates a device that uses power to provide cooling (e.g., via flow of a coolant, immersion in a coolant, etc.). Notably, the cooling structure or active cooling structure need not be in operation to be labeled as such. The active cooling structure may be part of the IC die, provided separate from the IC die, or both. In some contexts, an active cooling structure is not needed as the IC die is deployed in a very low temperature environment such as in any of a subpolar oceanic climate, a subarctic climate, an arctic climate, a tundra climate, an ice cap climate, or any other environment of sustained cold temperatures.

In some embodiments, a JFET includes a multi-layer quantum well channel having a well layer between first and second barrier layers, and a source, a gate structure, and a drain coupled to the multi-layer quantum well channel. In some embodiments, the materials deployed in barrier layers of the multi-layer quantum well channel are highly doped semiconductor materials such as $In_xGa_{1-x}As$ with very high indium composition, and the well layer may be a material such as InAs. At room temperatures, such materials do not exhibit semiconducting behavior but instead act as metallic materials. However, at very low temperatures, such materials exhibit semiconducting characteristics. For example, at very low temperatures, a band gap opens in such materials so they act as semiconductors and may be deployed in transistors.

In deployment at very low temperatures, JFETs using such materials systems have transistor behavior (exhibiting $I_{ON}/I_{OFF}$ behavior), however the $I_{OFF}$ (switch off behavior) may not be as strong as the $I_{ON}$ behavior. Therefore, such JFETs may advantageously be deployed as pull down devices. In some embodiments, the JFETs are used as pull down devices in constant current contexts at very low voltage. As used herein, the term very low voltage indicates a voltage of not more than 50 mV, although lower voltages may be used such as voltages of not more than 10 mV. In some embodiments, the JFETs are integrated with CMOS FETs such as CMOS FinFETs. Notably, after fabrication of the JFETs over a first substrate, the JFETs may be layer transferred to a second substrate such as a silicon substrate and the CMOS FETs may be fabricated in an exposed portion of the silicon substrate either on the same side as the JFETs or on an opposite side of the JFETs. The JFETs and CMOS FETs are then integrated into circuits that advantageously use both transistor types at very low temperature.

For example, the JFETs may be deployed as pull down transistors and the CMOS FETs may be deployed in constant current source circuitry.

As discussed, an IC die including JFETs and CMOS FETs may be deployed in a very low temperature context. In some embodiments, the operating temperature of the IC die is maintained at or below 0° C. In some embodiments, the operating temperature of the IC die is maintained at or below about −196° C. (i.e., using liquid nitrogen as the coolant). In some embodiments, the operating temperature of the IC die is maintained at or below about −25° C. In some embodiments, the operating temperature of the IC die is maintained at or below about −50° C. In some embodiments, the operating temperature of the IC die is maintained at or below about −70° C. In some embodiments, the IC die is maintained at or below about −100° C. Other temperatures may be used based on coolant, environment, and so on. Other temperatures may be used based on coolant, environment, and so on. In operation at such very low temperatures, the JFETs become operable and the CMOS FETs see a substantial boost in performance relative to operation at higher temperatures inclusive of increased carrier mobility, reduced contact resistance, and reduced leakage.

FIGS. 1A, 1B, 1C, 1D, 1E, 1F, 1G, 1H, 1I, and 1J illustrate cross-sectional views of junction field effect transistors as fabrication operations are performed, and integration of the junction field effect transistors with complementary metal oxide semiconductor field effect transistors, arranged in accordance with at least some implementations of the present disclosure. Referring first to FIG. 1A, a JFET system 100 includes a substrate 101, a graded buffer layer 102, a buffer layer 103, a dopant layer 104, a multi-layer quantum well channel 105, and an epitaxial source/drain layer 181. As shown, multi-layer quantum well channel 105 includes a well layer 107 between barrier layers 106, 108. In the context of FIG. 1A, well layer 107 is vertically between barrier layers 106, 108. The term JFET system is used to indicate a JFET system or apparatus at any level of integration of the JFET into an IC die, IC system, IC device, etc.

Substrate 101 may be any suitable material to facilitate the fabrication of JFET system 100. Substrate 101 may include any suitable material or materials. For example, substrate 101 may be a substrate substantially aligned along a predetermined crystal orientation (e.g., (100), (111), (110), or the like). In some examples, substrate 101 is a material that promotes the epitaxial growth of subsequent layers in the buildup. In some embodiments, substrate is InP having a (100) crystal orientation.

Graded buffer layer 102, buffer layer 103, dopant layer 104, and multi-layer quantum well channel 105 are formed on or over substrate 101 using any suitable technique or techniques. In some embodiments, graded buffer layer 102 is formed using epitaxial growth techniques such as molecular beam epitaxy. In some embodiments, graded buffer layer 102 is an $In_xAl_{1-x}As$ buffer layer having a lower indium composition (and higher aluminum composition) adjacent substrate 101 and a higher indium composition (and lower aluminum composition) opposite substrate 101 (e.g., with increasing indium concentration in the positive z-direction). In some embodiments, graded buffer layer 102 begins with a composition of about $In_{0.52}Al_{0.48}As$ on substrate 101 and ends with a composition of about $In_{0.81}Al_{0.19}As$ at the surface of graded buffer layer 102 distal from substrate 101. However, other compositions may be used. For example, the composition on the surface of substrate 101 may be in the range of $In_{0.4-0.6}Al_{0.6-0.4}As$ and the composition at the surface distal from substrate 101 may be in the range of about $In_{0.7-0.85}Al_{0.3-0.15}As$. Graded buffer layer 102 may have any suitable thickness such as a thickness in the range of 600 to 1,200 nm.

Buffer layer 103 may then be formed using the same or similar techniques. Buffer layer 103 has a substantially constant composition throughout its thickness such that the composition substantially matches that of the composition of graded buffer layer 102 formed at the surface of graded buffer layer 102 distal from substrate 101. For example, buffer layer 103 may have a composition of $In_{0.81}Al_{0.19}As$ throughout a thickness thereof. In some embodiments, buffer layer 103 has a composition in the range of $In_{0.7-0.85}Al_{0.3-0.15}As$ throughout a thickness thereof. Buffer layer 103 may have any suitable thickness such as a thickness in the range of 400 to 1,000 nm. As shown, in some embodiments, a dopant layer 104 (e.g., a silicon delta doping layer) may be formed at a depth within buffer layer 103. For example, dopant layer 104 may be formed at about 5 to 10 nm below a top surface of buffer layer 103.

Multi-layer quantum well channel 105 is then be formed on buffer layer 103 such that barrier layer 106 is on buffer layer 103, barrier layer 106 is on well layer 107, and barrier layer 108 is on well layer 107. For example, barrier layer 106, well layer 107, and barrier layer 108 may be formed using epitaxial techniques such as molecular beam epitaxy. In some embodiments, multi-layer quantum well channel 105 includes a crystalline well layer 107 between crystalline barrier layers 106, 108 (i.e., well layer 107 is a crystalline material). As used herein, the term crystalline indicates a material of constituents arranged in a highly ordered structure. A crystalline material may be monocrystalline, though it need not be. Furthermore, as used herein, the one or more atoms listed after the term crystalline indicate atoms that are part of the crystal lattice of the crystalline material, though other dopant materials may also be part of the crystalline material. Therefore, the term crystalline silicon indicates the material includes one or more crystals of silicon, which optionally includes dopant materials. The term crystalline indium and arsenic indicates the material includes one or more crystals of indium and arsenic (i.e., indium arsenide, or InAs), which optionally includes dopant materials.

In some embodiments, well layer 107 is crystalline indium and arsenic (e.g., InAs). For example, well layer 107 may be substantially pure, pure, or completely pure crystalline indium arsenide. In some embodiments, crystalline barrier layers 106, 108 are each crystalline indium, gallium, and arsenic. For example, crystalline barrier layers 106, 108 may have a composition of $In_{0.81}Ga_{0.19}As$. Other concentration ranges may be used. In some embodiments, crystalline barrier layers 106, 108 has a composition in the range of $In_{0.7-0.85}Ga_{0.3-0.15}As$. Well layer 107 and barrier layers 106, 108 provide a multi-layer quantum well channel 105, which may be characterized as a quantum well heterostructure.

In some embodiments, epitaxial source/drain layer 181 is then formed on barrier layer 108, as shown. Epitaxial source/drain layer 181 is made of a material that will eventually be patterned to form a source and a drain for JFET system 100, and a gate structure is subsequently formed between the source and the drain, as discussed with respect to FIG. 1B. In other embodiments, a gate structure may first be formed and subsequently a source and a drain are formed. For example, source/drain and gate structures may be formed in any order. Using either technique, a source and a drain of the material discussed with respect to epitaxial source/drain layer 181 is formed.

Epitaxial source/drain layer 181 is advantageously formed such that it is lattice matched to barrier layer 108. For example, epitaxial source/drain layer 181 is epitaxially grown from barrier layer 108 using any suitable techniques such as molecular beam epitaxy. Furthermore, epitaxial source/drain layer 181 is advantageously crystalline indium and arsenic (e.g., InAs). For example, epitaxial source/drain layer 181 may be substantially pure, pure, or completely pure crystalline indium arsenide. Deployment of indium arsenide as the source/drain layer in the material system of JFET system 100 offers advantages, particularly at very low temperatures, inclusive of low resistance. Furthermore, use of indium arsenide in the source/drain offers low resistance and other benefits in the interface with source and drain contacts made on the indium arsenide. Such advantages are realized in the context of tungsten, tantalum, copper, ruthenium, titanium, and other metals but are particularly realized in the use of tungsten or tantalum in contacting the source/drain in JFET system 100. The formation of such source and drain contacts is discussed further herein below.

Figure 1B:
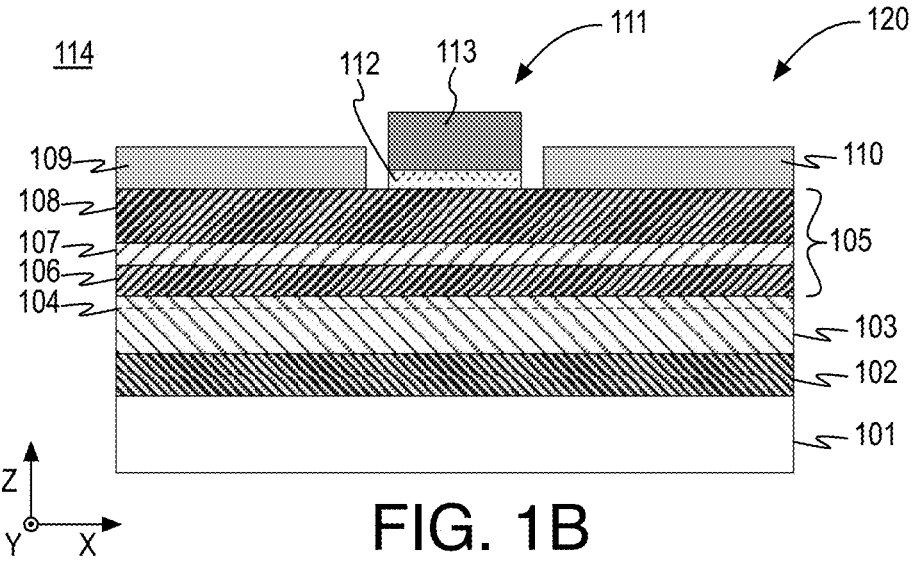

FIG. 1B illustrates a cross-sectional view of a JFET system 114 similar to JFET system 100 after the formation of a source 109 and a drain 110 from epitaxial source/drain layer 181, and the formation of a gate structure 111 between source 109 and drain 110. JFET system 114 may be formed using any suitable technique or techniques. Notably, JFET system 114 may include any number of JFETs 120. In some embodiments, epitaxial source/drain layer 181 is patterned and etched to form source 109 and drain 110. Subsequently, a bulk gate dielectric layer and bulk gate electrode layer are formed using any suitable deposition techniques and then patterned using lithography and etch techniques to form gate structure 111 inclusive of gate dielectric 112 and gate electrode 113. In other embodiments, the bulk gate dielectric layer and bulk gate electrode layer are formed on barrier layer 108 and then patterned, and, subsequently, source 109 and drain 110 are grown from exposed regions of barrier layer 108. As shown, gate dielectric 112 is on barrier layer 108 and gate electrode is on gate dielectric 112. In some embodiments, gate dielectric 112 extends up sidewalls of gate electrode 113 and gate dielectric 112. In some embodiments, sidewall spacers (other than gate dielectric 112) may be provided on sidewalls of gate electrode 113 such that the sidewall spacers are between gate electrode 113 and source 109 and between gate electrode 113 and drain 110. Other isolation structures may be used. Any distance between source 109 and drain 110 (i.e., channel length) may be provided. For example, the lateral distance (in the x-direction) from the right edge of source 109 and the left edge of drain 110 may be any value. In some embodiments, the lateral distance is in the range of 100 to 500 nm with 300 nm being particularly advantageous. In some embodiments, the lateral distance is in the range of 100 to 500 nm to 2 um.

Gate dielectric 112 may include any suitable high-k dielectric material. As used herein, the term high-k dielectric material indicates a dielectric material having dielectric constant greater than that of silicon dioxide (e.g., greater than 3.9). The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in gate dielectric 112 include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used. In some embodiments, gate dielectric 112 is advantageously hafnium oxide, which offers advantages such as improved gate control, particularly at very low temperatures. In some embodiments, gate dielectric 112 is advantageously a very thin layer of hafnium oxide, which again offers advantages such as improved gate control, particularly at very low temperatures. In some embodiments, gate dielectric 112 is hafnium oxide having a thickness of not more than 8 nm. In some embodiments, gate dielectric 112 is hafnium oxide having a thickness of not more than 5 nm. In some embodiments, gate dielectric 112 is hafnium oxide having a thickness of not more than 2 nm.

Gate electrode 113 is on gate dielectric 112 and includes an n-type work function metal. In some embodiments, gate electrode 113 is a stack of two or more metal layers, where one or more metal layers are work function metal layers and at least one metal layer is a fill metal layer. For example, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide.

Figure 1C:
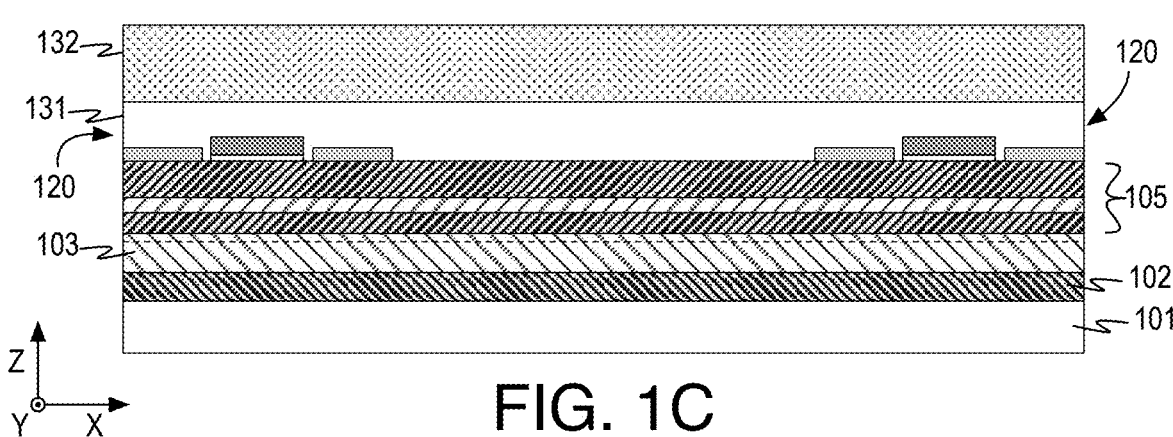
Figure 1D:
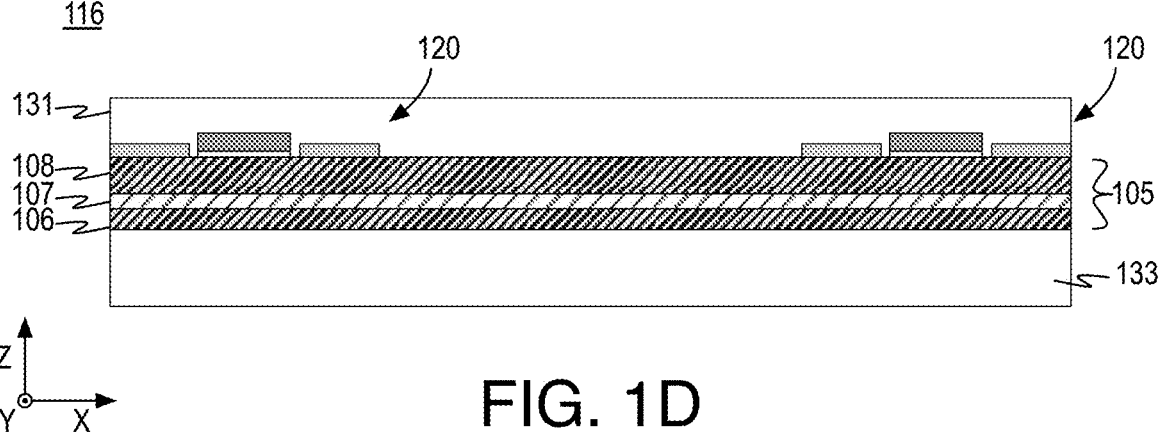

FIG. 1C illustrates a cross-sectional view of a JFET system 115 similar to JFET system 114 after the formation of a protective layer 131 over JFETs 120 and attachment of a carrier wafer 132 to protective layer 131. Notably, it may be advantageous to replace the substrate below JFETs 120 for one or both of isolation of multi-layer quantum well channel 105 and for the deployment of highly integrated CMOS FETs. Protective layer 131 may be any suitable material at any suitable thickness that protects JFETs 120. In some embodiments, protective layer 131 is an oxide material such as silicon oxide. However, other materials may be used such as carbon-doped oxides, siloxane derivatives, and the like. Carrier wafer 132 may be any suitable material that provides mechanical support during subsequent processing as well as adhesion to protective layer 131. In some embodiments, carrier wafer 132 is a silicon wafer. It is noted that in subsequent back-side removal operations, substrate 101 and graded buffer layer 102 are removed. In addition, a portion or an entirety of buffer layer 103 may also be removed. FIG. 1D illustrates an entirety of buffer layer 103 being removed and FIG. 1E illustrates a portion of buffer layer 103 being removed.

FIG. 1D illustrates a cross-sectional view of a JFET system 116 similar to JFET system 115 after the back-side removal of substrate 101, graded buffer layer 102, and buffer layer 103, attachment of substrate 133, and the subsequent removal of carrier wafer 132. For example, back-side grind operation(s), back-side etch operation(s), or the like are deployed to remove substrate 101, graded buffer layer 102, and buffer layer 103. Subsequently, multi-layer quantum well channel 105 (e.g., a channel hetero-junction) is mounted or grafted onto a second substrate 133 such that barrier layer 106 is on substrate 133.

Substrate 133 may be a semiconductor substrate such as a semiconductor wafer of silicon or another semiconductor material. Suitable semiconductor substrates include, but are not limited to, single crystal silicon, poly crystalline silicon and silicon on insulator (SOI). The substrate may also include semiconductor materials, metals, dielectrics, dopants, and other materials commonly found in semiconductor substrates. In some embodiments, substrate 133 is a substrate substantially aligned along a predetermined crystal orientation (e.g., (100), (111), (110), or the like). In some examples, substrate 133 is monocrystalline silicon (Si), although other materials may be used such as germanium (Ge), silicon germanium (SiGe), a III-V materials based material (e.g., gallium arsenide (GaAs)), a silicon carbide (SiC), a sapphire ($Al_2O_3$), or any combination thereof. In some examples, substrate 133 is silicon having a (100) crystal orientation. In some embodiments, substrate 133 is (111) silicon or (110) silicon. For example, substrate 133 may be a crystalline silicon substrate and multi-layer quantum well channel 105 is over and coupled thereto. Substrate 133 may be attached to barrier layer 106 using any suitable technique or techniques. In some embodiments, an oxide layer is formed between substrate 133 and barrier layer 106. Subsequent to the mounting of substrate 133, carrier wafer 132 is removed using any suitable technique or techniques.

Figure 1E:
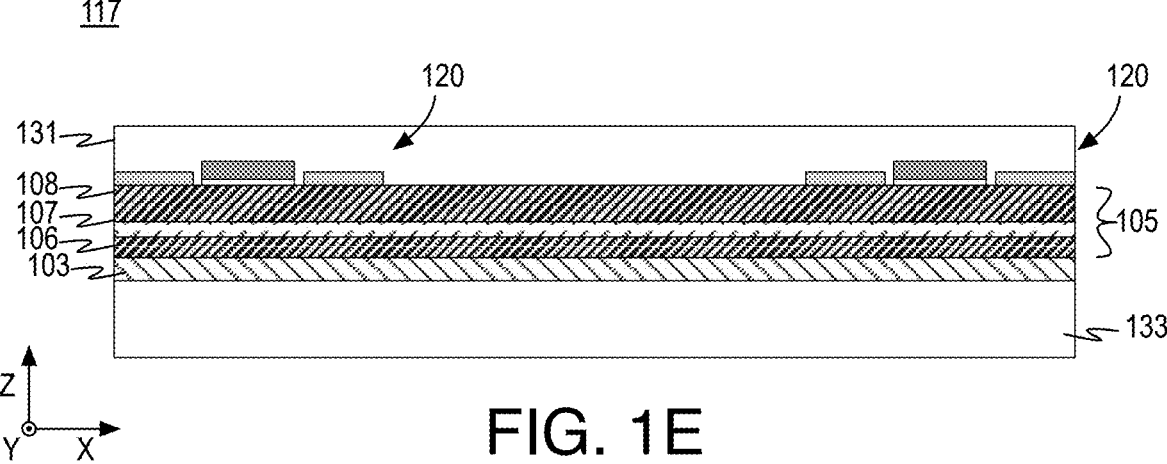

FIG. 1E illustrates a cross-sectional view of a JFET system 117 similar to JFET system 115 after the back-side removal of substrate 101 and graded buffer layer 102, attachment of substrate 133, and the subsequent removal of carrier wafer 132. As discussed with respect to FIG. 1D, back-side grind operation(s), back-side etch operation(s), or the like are deployed to remove substrate 101 and graded buffer layer 102. Optionally, a portion of buffer layer 103 is also removed. Subsequently, multi-layer quantum well channel 105 and buffer layer 103 or the remaining portion thereof is mounted or grafted onto a second substrate 133 such that buffer layer 103 or the remaining portion thereof is on substrate 133.

Substrate 133 may include any characteristics discussed with respect to FIG. 1D and substrate 133 be may be attached to buffer layer 103 using any suitable technique or techniques. In some embodiments, an oxide layer is formed between substrate 133 and buffer layer 103. Subsequent to mounting onto substrate 133, carrier wafer 132 is removed using any suitable technique or techniques.

As discussed, substrate 133 may offer improved performance of JFETs 120 by providing improved isolation. In addition or in the alternative, substrate 133 may provide for the formation of CMOS FETs such as CMOS FinFETs as illustrated FIGS. 1F-1J. In FIGS. 1F-1J, JFET system 116 of FIG. 1D is used as exemplary; however, such processing may proceed in the same manner using JFET system 117 of FIG. 1E.

Figures 1F, 1G, 1H, 1I:
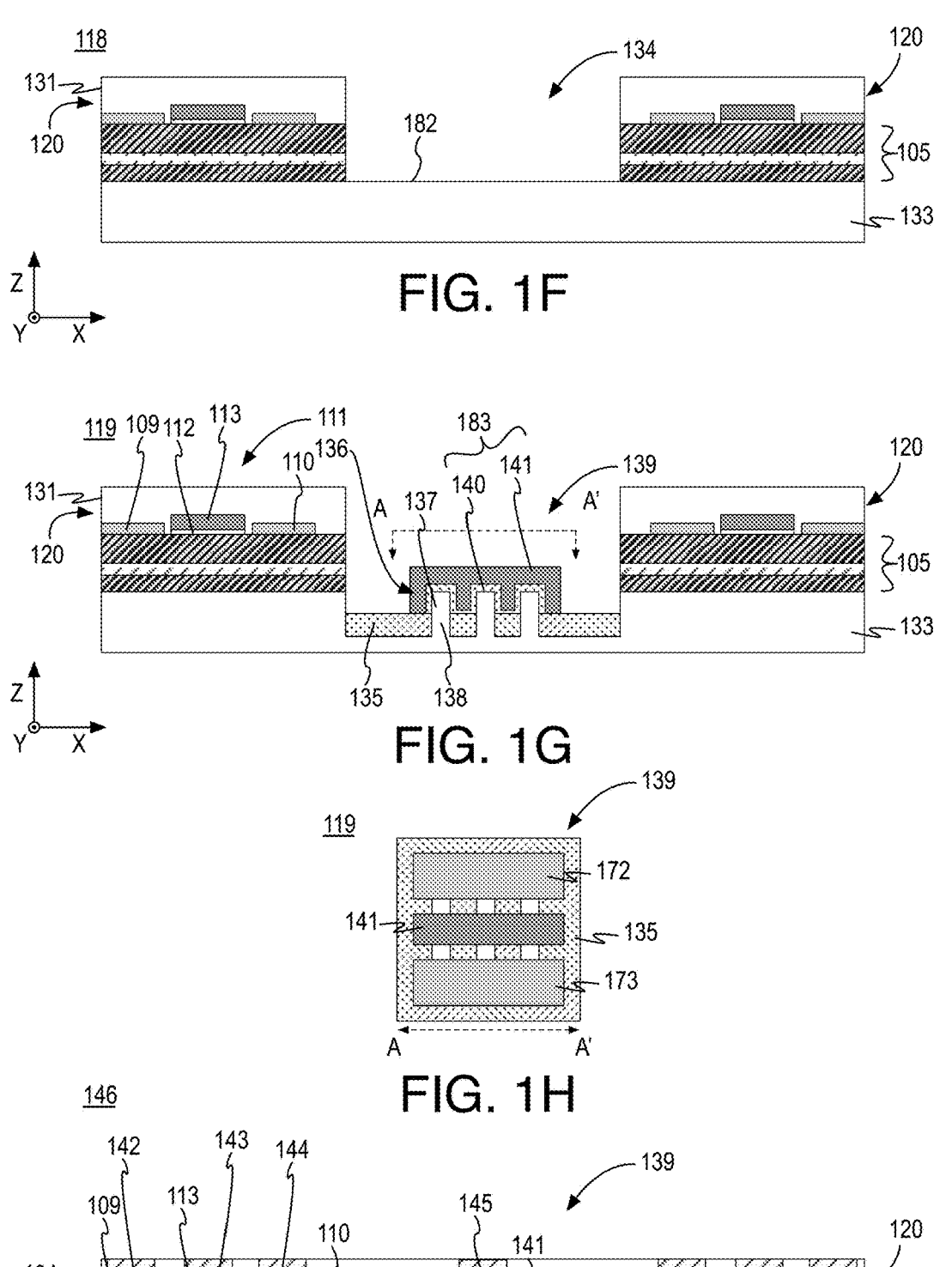

FIG. 1F illustrates a cross-sectional view of a JFET system 118 similar to JFET system 116 after the patterning of protective layer 131 and multi-layer quantum well channel 105 to expose a region 182 of substrate 133. In the context of FIG. 1F, multi-layer quantum well channel 105 may be characterized as a multi-layer quantum well stack or multi-layer stack.

Protective layer 131 and multi-layer quantum well channel 105 may be patterned using any suitable technique or techniques. In some embodiments, a patterned layer is formed on or over protective layer 131 using lithography techniques. In some embodiments, protective layer 131 is removed and replaced by another layer such as a silicon oxide layer, which also may be planarized prior to such patterning thereon. Subsequent to the formation of the patterned layer, etch techniques may be deployed to form an opening 134 in protective layer 131 and multi-layer quantum well channel 105 (or the multi-layer stack) to expose region 182. In the illustration herein, region 182 is shown as providing the area (i.e., in the x-y plane) sufficient to form multiple fins of a FinFET. However, region 182 may provide any lateral spacing between JFETs 120, or at regions outside of JFETs 120 for the subsequent formation of any number of FinFETs.

FIG. 1G illustrates a cross-sectional view of a JFET system 119 similar to JFET system 118 after the formation of a FinFET 139 within region 182. In the illustrated examples, a FinFET is formed. However, any suitable FET inclusive of planar or non-planar FETs may be formed. As used herein the term non-planar transistor indicates a transistor having more than a single plane interface between the gate and channel structure. Such non-planar transistors may also be characterized as multi-gate devices, multi-gate MOSFETs, or the like. In some embodiments, JFET system 119 deploys non-planar transistors inclusive of FinFETs or gate all around (GAA) FET devices (i.e., nanowire or nanoribbon channel devices).

FinFET 139 may be formed using any suitable technique or techniques. In some embodiments, protective layer 131 protects JFETs 120 during such processing. In some embodiments, fins 136 are formed from substrate 133 via patterning and etch techniques. For example, fins 136 may extend above substrate 133 after removal of portions of substrate 133 adjacent fins 136. In some embodiments, a sub-fin isolation 135 is then formed via deposition and etch back techniques. Sub-fin isolation 135 may be any amorphous material suitable for providing electrical isolation between adjacent sub-fins 138 of fins 136. In some embodiments, sub-fin isolation 135 is silicon dioxide. Other known dielectric materials may also be employed, including low-k materials. Although embodiments are not limited in this respect, other exemplary materials include carbon-doped oxides, siloxane derivatives, and the like. As shown, above portions of sub-fins 138, fins 136 include channel regions 137 that are coupled to by gate structures 183. In some embodiments, channel regions 137 are doped semiconductor material.

Gate structures 183 inclusive of gate dialectic 140 and gate electrode 141 are then formed using deposition, patterning, and etch techniques. Gate dielectric 140 may include one layer or a stack of layers. The one or more layers of gate dielectric 140 may include silicon oxide, silicon dioxide ($SiO_2$), and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in gate dielectric 140 include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

Gate electrode 141 is on the gate dielectric layer and may include of at least one of a p-type work function metal or an n-type work function metal, depending on whether the transistor is a PMOS or an NMOS transistor. In some embodiments, gate electrode 141 is a stack of two or more metal layers, where one or more metal layers are work function metal layers and at least one metal layer is a fill metal layer. For a PMOS transistor, metals that may be used for the gate electrode include, but are not limited to, ruthenium, palladium, platinum, cobalt, nickel, and conductive metal oxides, e.g., ruthenium oxide. A p-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An n-type metal layer will enable the formation of an NMOS gate electrode with a work function that is between about 3.9 eV and about 4.2 eV.

FIG. 1H illustrates a top-down view of JFET system 119. As shown, gate electrode 141 of gate structure 183 is between a source 172 and a drain 173. Source 172 and drain 173 may be formed using any suitable technique or techniques. In some embodiments, source 172 and drain 173 are formed using epitaxial growth techniques, although other techniques may be deployed. For example, source and drain regions may be formed using either an implantation/diffusion process or an etching/deposition process. In the implantation/diffusion process, dopants such as boron, aluminum, antimony, phosphorous, or arsenic may be ion-implanted into fin 136 to form source and drain regions and an anneal activates the dopants and causes them to diffuse. In the etching/deposition process, fins 136 may be etched and an epitaxial deposition process is then used to grow source 172 and drain 173. In some embodiments, source 172 and drain 173 are a silicon alloy such as silicon germanium or silicon carbide. In some embodiments, source 172 and drain 173 are an epitaxially deposited silicon alloy doped in situ with dopants such as boron, arsenic, or phosphorous. In some embodiments, source 172 and drain 173 are germanium or a group III-V material or alloy.

FIG. 1I illustrates a cross-sectional view of a JFET system 146 similar to JFET system 119 after the formation of an isolation 184, source and drain contacts 142, 144 to JFETs 120, gate contact 143 to JFET 120, and source and drain contacts to FinFET 139 (not shown in the view of FIG. 1I) and gate contact 145 to FinFET 139. As shown, source contact 142 is on source 109, drain contact 144 is on drain 110, and gate contact 143 is on gate electrode 113. Similarly, a drain contact is on drain 173, a source contact is on source 172, and gate contact 145 is on gate electrode 141. In some embodiments, isolation 184 is formed using any suitable technique or techniques such as removal of protective layer 131, deposition of a dielectric material or isolation material, and planarization or deposition of a dielectric material with protective layer 131 and subsequent planarization. Isolation 184 may include any suitable material such as an amorphous material suitable for providing electrical isolation inclusive of silicon dioxide, carbon-doped oxides, or siloxane derivatives.

Contacts 142-145 may be formed using any suitable technique or techniques such as damascene techniques. For example, a patterned layer may be formed over isolation 184, openings may be formed, the openings may be filled to provide contacts 142-145 and planarization may be performed to provide the structure of JFET system 146. In some embodiments, contacts 142-145 are formed of the same material using the same processing operations. However, contacts 142-145 may be formed in separate operations to provide different materials for some of contacts 142-145.

In some embodiments, some or all of contacts 142-145 are a metal such as tungsten, tantalum, copper, ruthenium, or titanium. In some embodiments, at least contacts 142, 144 are tungsten or tantalum. Such materials offer advantages in interfacing with the substantially pure, pure, or completely pure indium arsenide of source 109 and drain 110, as discussed above. In some embodiments, at least contacts 142, 144 are substantially pure, pure, or completely pure tungsten or tantalum.

Notably, in the example of FIG. 1I, JFETs 120 and FinFETs 139 are on a same side of substrate, which may be characterized as the front-side of substrate 133. Furthermore, various components of JFETs 120 and FinFETs 139 may be co-planar (i.e., in the x-y plane). For example, a portion of gate electrode 141 is coplanar with a portion of multi-layer quantum well channel 105, portions of source 109, drain 110, and gate electrode 113 are co-planar with source contact 145, and so on.

Figure 1J:
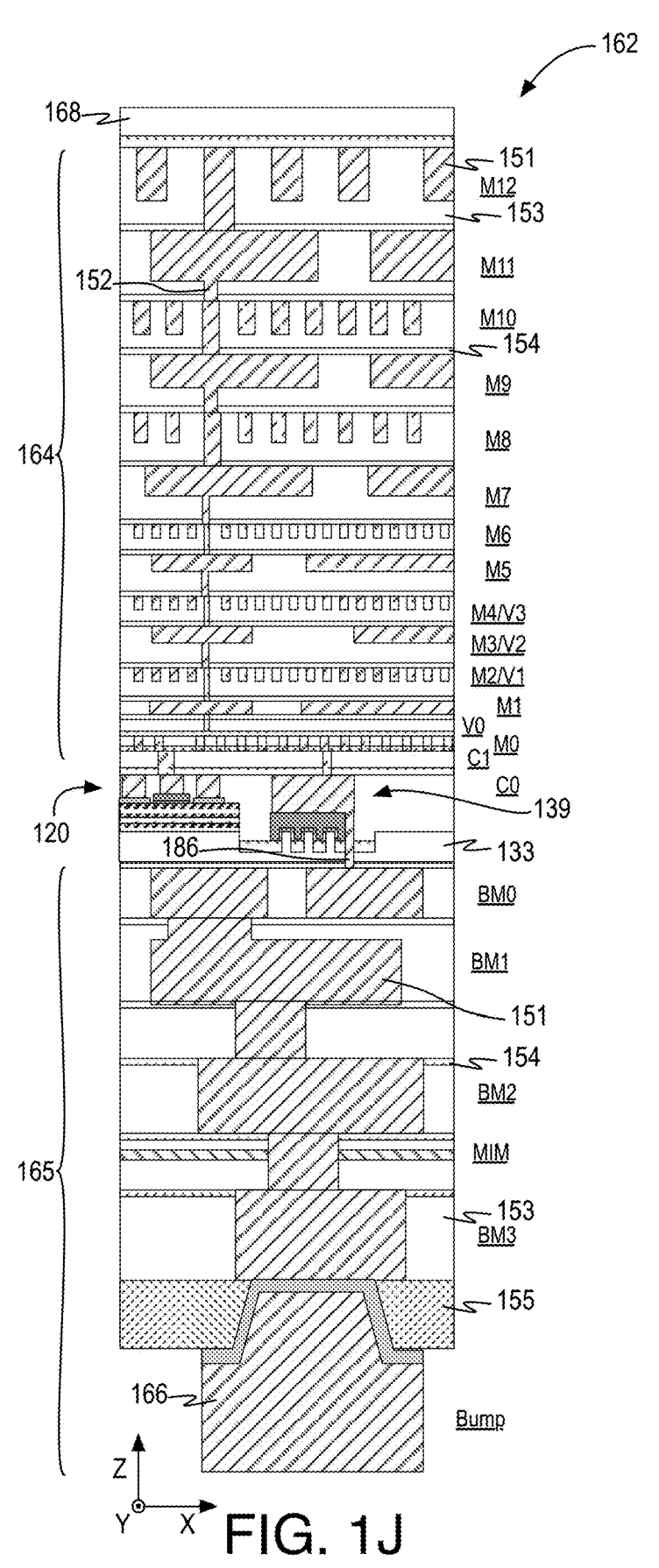

FIG. 1J illustrates a cross-sectional view of a JFET system 147 similar to JFET system 146 after the formation of front-side metallization layers 164 (or front-side interconnect layers) and optional back-side metallization layers 165 (or back-side interconnect layers) to form an integrated circuit (IC) die 162. Front-side metallization layers 164 may be formed using any suitable technique or techniques such as dual damascene techniques, single damascene techniques, subtractive metallization patterning techniques, or the like. Similarly, back-side metallization layers 165 may be formed using any suitable technique or techniques. In some embodiments, after front-side processing, the front-side of the wafer is attached to a carrier substrate and back-side removal processing (e.g., back-side grind or etch) is used to thin the wafer. As shown, FinFETs 139 may then be contacted from the back-side using through via contacts 186. Back-side metallization layers 165 are then formed using dual damascene, single damascene, subtractive metallization patterning, etc.

For example, interconnectivity of JFETs 120 and/or FinFETs 139, signal routing to and from JFETs 120 and/or FinFETs 139, power delivery to JFETs 120 and/or FinFETs 139, and routing to an outside device (not shown), is provided by front-side metallization layers 164, optional back-side metallization layers 165, and package level interconnects 166. In the illustrated example, package level interconnects 166 are provided on or over a back-side of IC die 162 as bumps over a passivation layer 155. However, package level interconnects 166 may be provided using any suitable interconnect structures such as bond pads, solder bumps, etc. Furthermore, in some embodiments, package level interconnects 166 are provided on or over a front-side of IC die 162 (i.e., over front-side metallization layers 164) and a package level cooling structure is provided on or over a back-side of IC die.

As used herein, the term metallization layer indicates metal interconnections or wires that provide electrical routing. Adjacent metallization layers, such as metallization interconnects 151, are interconnected by vias, such as vias 152, that may be characterized as part of the metallization layers or between the metallization layers. As shown, in some embodiments, front-side metallization layers 164 are formed over and immediately adjacent JFETs 120 and/or FinFETs 139. As used herein, the term front- and back-side are used in their ordinary meaning in the art based on the buildup direction of IC die 162 with the front-side being the side exposed during processing. The back-side is then the opposite side, which may be exposed during processing by attaching the front-side to a carrier wafer and exposing the back-side (e.g., by back-side grind or etch operations) as known in the art.

In some embodiments, front-side metallization layers 164 provide signal routing and back-side metallization layers 165 provide power delivery to at least FinFETs 139, as enabled by through via contacts 186. For example, implementation of integrated JFETs 120 and FinFETs 139 in a single IC die 162 may be advantageously attainable based at least in part on deployment at very low temperature and using front-side metallization layers 164 and back-side metallization layers 165.

In the illustrated example, front-side metallization layers 164 include M0, V0, M1, M2/V1, M3/V2, M4/V3, and M4-M12. However, front-side metallization layers 164 may include any number of metallization layers such as eight or more metallization layers. Similarly, back-side metallization layers 165 include BM0, BM1, BM2, and BM3. However, back-side metallization layers 165 may include any number of metallization layers such as two to five metallization layers. Front-side metallization layers 164 and back-side metallization layers 165 are embedded within dielectric materials 153, 154. Furthermore, optional metal-insulator-metal (MIM) devices such as diode devices may be provided within back-side metallization layers 165. Other devices such as capacitive memory devices may be provided within front-side metallization layers 164 and/or back-side metallization layers 165.

Discussion now turns to alternative embodiments where FinFETs 139 are formed opposite substrate 133 from JFETs 120. For example, processing may commence from JFET system 116 of FIG. 1D or JFET system 117 of FIG. 1E, with JFET system 116 of FIG. 1D being used as exemplary.

FIGS. 2A, 2B, 2C, 2D, and 2E illustrate cross-sectional views of junction field effect transistors as fabrication operations are performed, and integration of the junction field effect transistors with complementary metal oxide semiconductor field effect transistors, arranged in accordance with at least some implementations of the present disclosure.

Figures 2A, 2B:
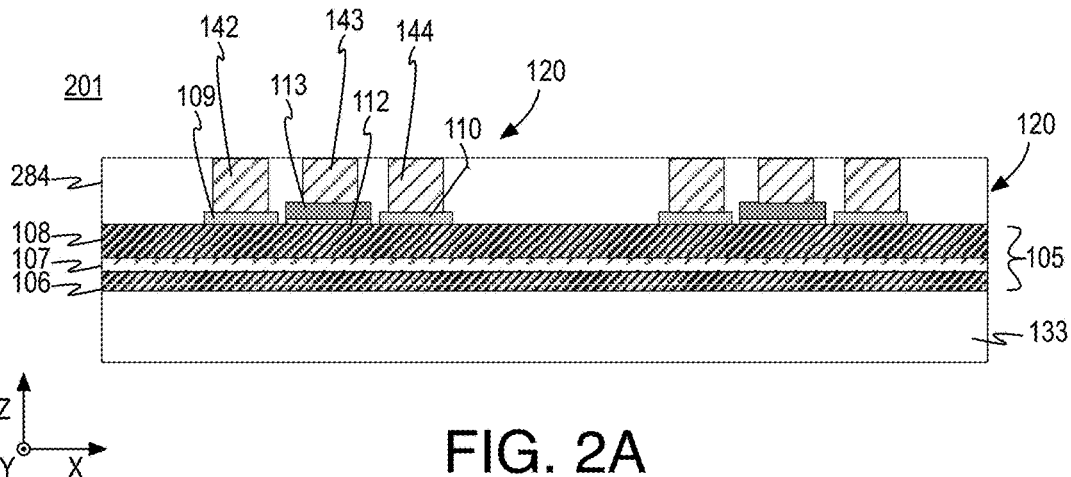
FIGS. 2A, 2B, 2C, 2D, and 2E illustrate cross-sectional views of junction field effect transistors as fabrication operations are performed, and integration of the junction field effect transistors with complementary metal oxide semiconductor field effect transistors.

FIG. 2A illustrates a cross-sectional view of a JFET system 201 similar to JFET system 116 after the formation of source contact 142 on source 109, drain contact 144 on drain 110, and gate contact 143 on gate electrode 113. Such contacts 142, 143, 144 may be made to each of JFETs 120. In some embodiments, isolation 284 is formed using any suitable technique or techniques such as removal of protective layer 131, deposition of a dielectric material, and planarization. Isolation 284 may include any suitable material such as an amorphous material suitable for providing electrical isolation inclusive of silicon dioxide, carbon-doped oxides, or siloxane derivatives. In some embodiments, protective layer 131 is deployed in place of isolation 284. Contacts 142-144 may be formed using any suitable technique or techniques such as damascene techniques inclusive of forming a patterned layer over isolation 284, forming openings in isolation 284, filling the openings with metal, and planarization to form contacts 142-144. Contacts 142-144 may include any materials discussed herein above including metals such as tungsten, tantalum, copper, ruthenium, or titanium. In some embodiments, at least contacts 142, 144 are advantageously tungsten or tantalum, as discussed.

FIG. 2B illustrates a cross-sectional view of a JFET system 221 similar to JFET system 201 after the formation of front-side metallization layers 164. Front-side metallization layers 164 may be formed using any suitable technique or techniques such as dual damascene techniques, single damascene techniques, subtractive metallization patterning techniques, or the like. Front-side metallization layers 164 may have any characteristics discussed herein above. As shown, front-side metallization layers 164 contact contacts 142-144 to JFETs 120. For example, interconnectivity, signal routing, power delivery, etc. for JFETs 120 may be provided by front-side metallization. In the example of FIG.

2B, front-side metallization layers 164 include M1-M5; however, front-side metallization layers 164 may include any number of metallization layers such as eight or more metallization layers.

Figure 2C:
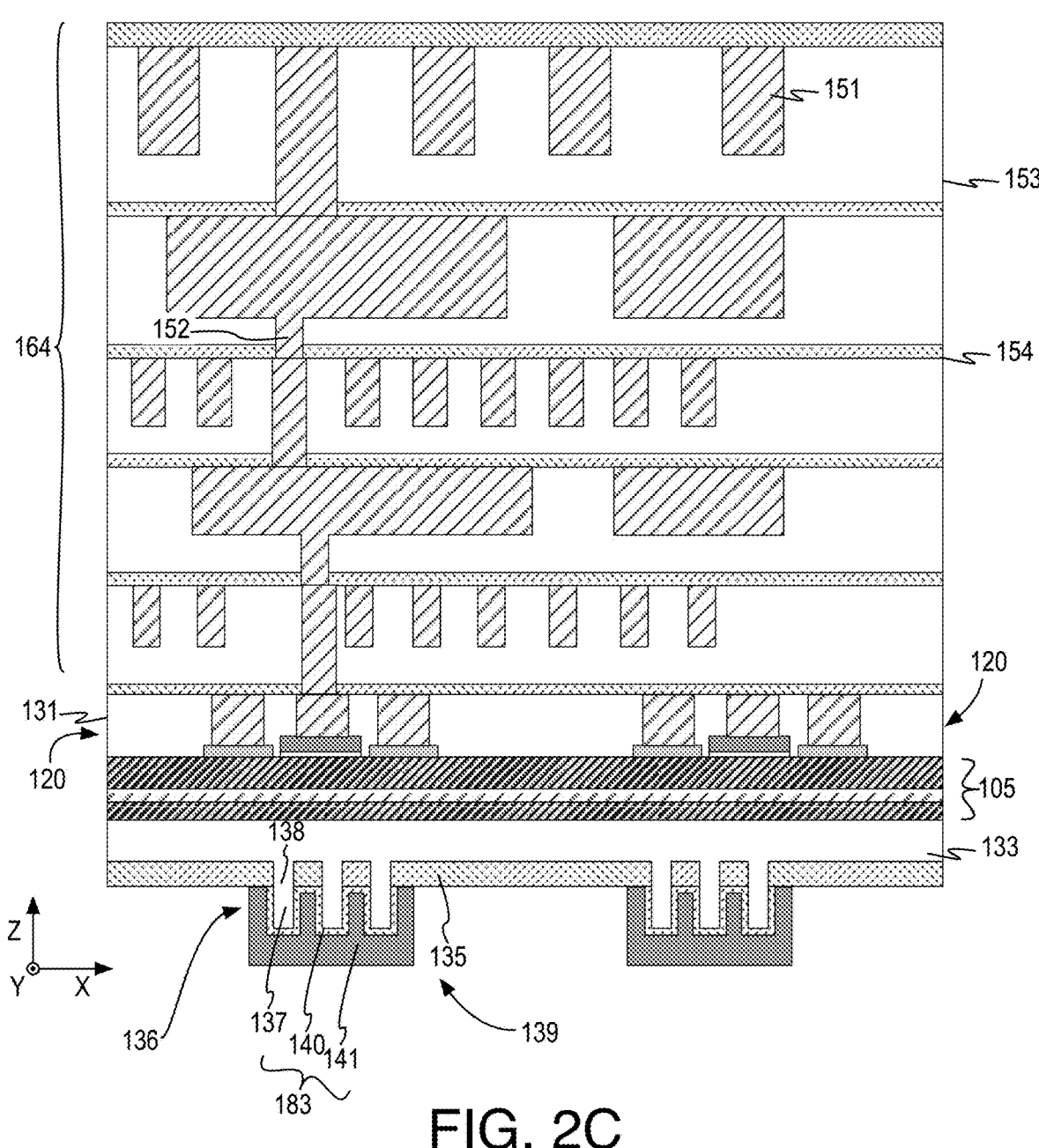

FIG. 2C illustrates a cross-sectional view of a JFET system 222 similar to JFET system 221 after the formation of FinFET 139 on a back-side of substrate 133. In the illustrated example, a FinFET is formed. However, any suitable FET inclusive of planar or non-planar FETs may be formed. FinFET 139 may be formed using any suitable technique or techniques. In some embodiments, a front-side of JFET system 222 is attached to a carrier wafer (not shown) and a back-side of substrate 133 is thinned (i.e., from about 500 μm to about 50 to 100 nm). In some embodiments, fins 136 are then formed from substrate 133 via patterning and etch techniques. In some embodiments, sub-fin isolation 135 is then formed via deposition and etch back techniques. As shown, above portions of sub-fins 138, fins 136 include channel regions 137 that are coupled to by gate structures 183. For example, gate structures 183 inclusive of gate dialectic 140 and gate electrode 141 are subsequently formed using deposition, patterning, and etch techniques.

Furthermore, reference is made to FIG. 1H. Notably, FinFET 139 includes source 172 and drain 173 such that gate structure 183 is between a source 172 and a drain 173. Source 172 and drain 173 may be formed using any suitable technique or techniques. In some embodiments, source 172 and drain 173 are formed using epitaxial growth techniques, although other techniques may be deployed. For example, source and drain regions may be formed using either an implantation/diffusion process or an etching/deposition process, as discussed above. The components of FinFET 139 may have any characteristics discussed herein above.

Figure 2D:
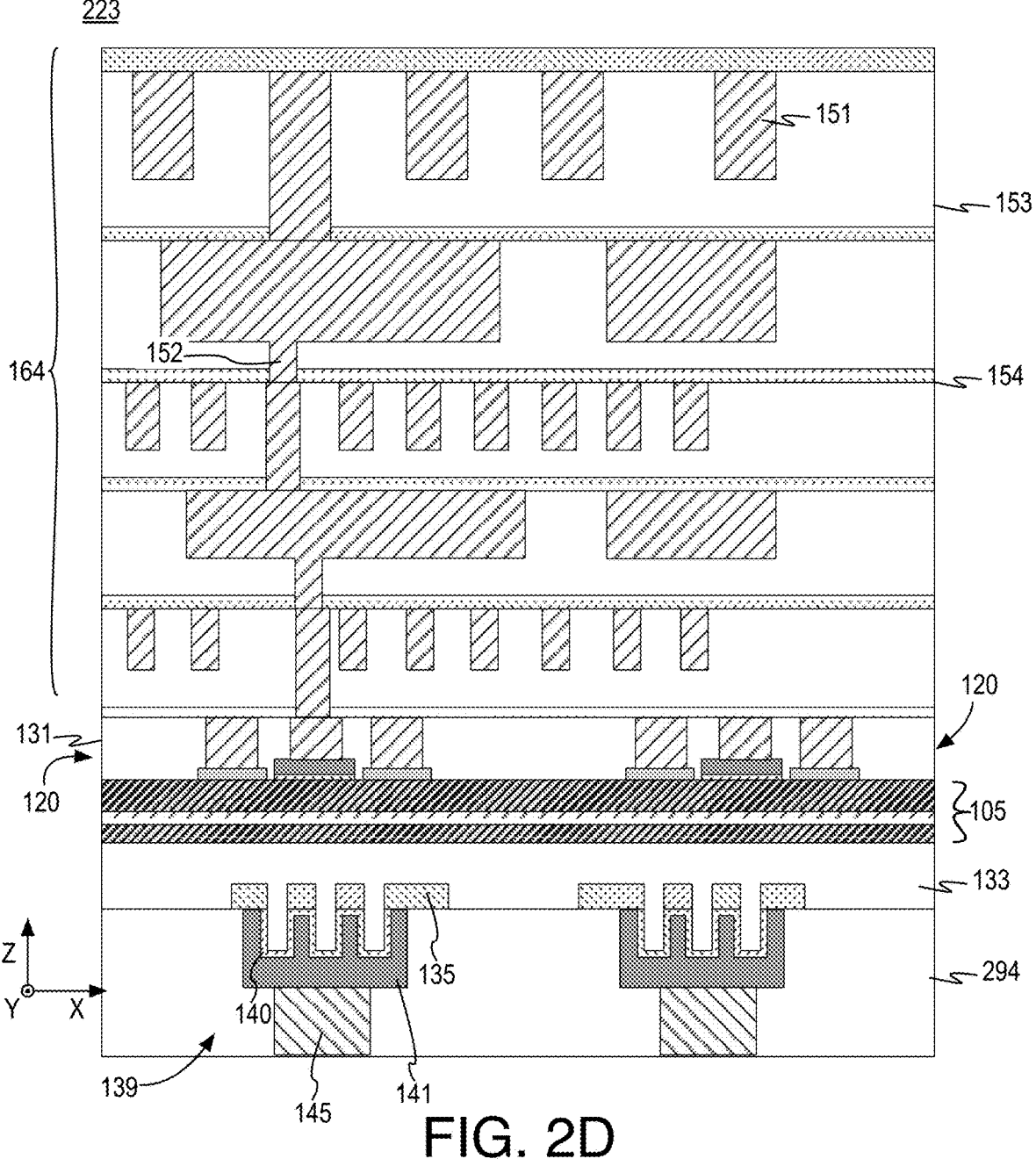

FIG. 2D illustrates a cross-sectional view of a JFET system 223 similar to JFET system 222 after the formation of gate contact 145 and a source contact and a drain contact (not shown in the view of FIG. 2D). Isolation 294 is formed using any suitable technique or techniques such as deposition of a dielectric material and planarization. Isolation 294 may include any suitable material such as an amorphous material suitable for providing electrical isolation inclusive of silicon dioxide, carbon-doped oxides, or siloxane derivatives. Contacts 145 and source and drain contacts (not shown) may be formed using any suitable technique or techniques such as damascene techniques inclusive of forming a patterned layer over isolation 294, forming openings in isolation 294, filling the openings with metal, and planarization to form the contacts, which may include any materials discussed herein above.

Figure 2E:
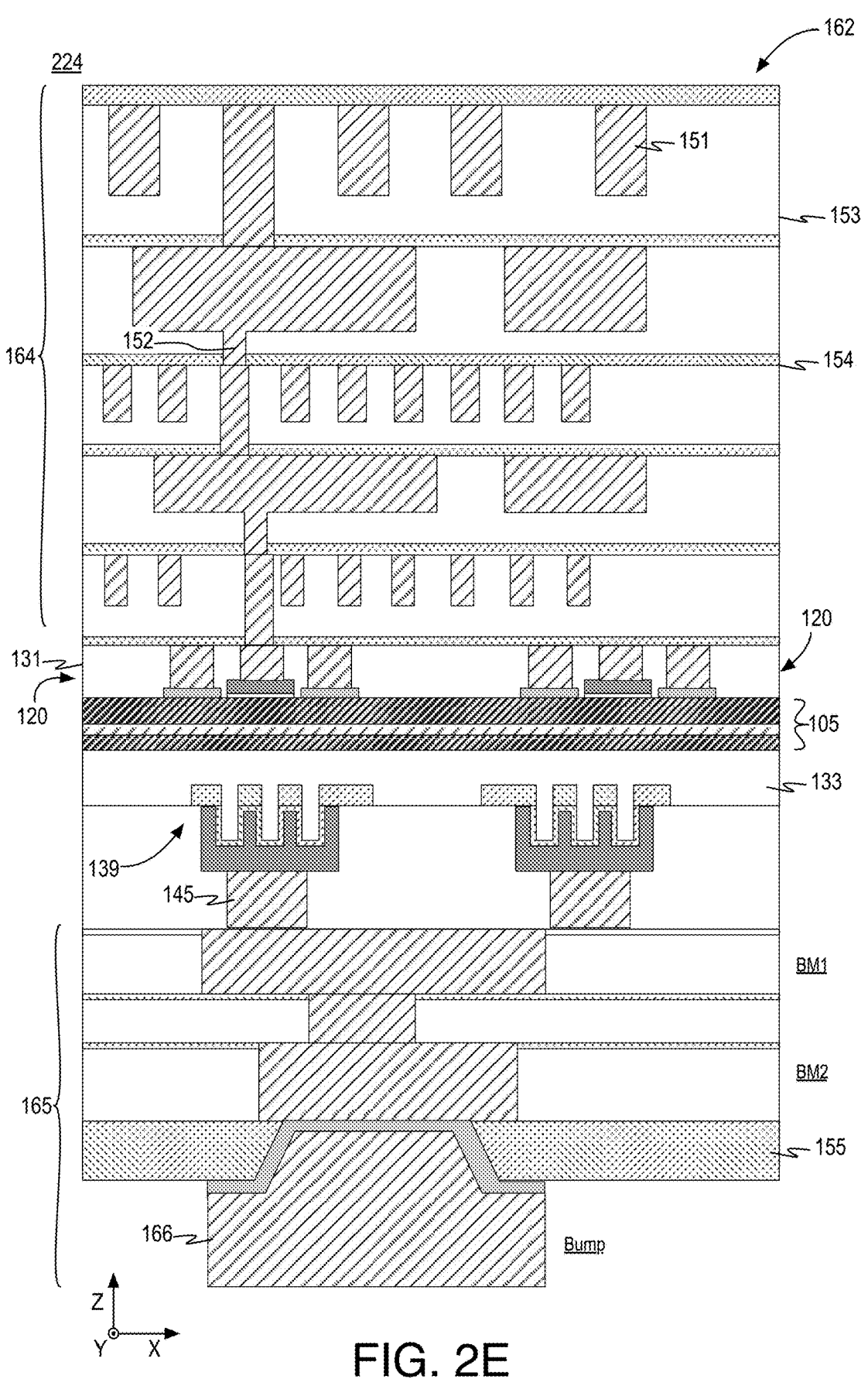

FIG. 2E illustrates a cross-sectional view of a JFET system 224 similar to JFET system 223 after the formation of back-side metallization layers 165. Back-side metallization layers 165 may be formed using any suitable technique or techniques. In some embodiments, back-side metallization layers 165 may be formed using dual damascene, single damascene, subtractive metallization patterning, etc. In some embodiments, the previously discussed carrier wafer is then removed. For example, interconnectivity, signal routing, power delivery for FinFETs 139 may be provided by back-side metallization layers 165. In some embodiments, front-side metallization layers 164 are coupled to back-side metallization layers 165 using through-vias. Similarly, contact may be made to FinFETs 139 by front-side metallization layers 164 and/or contact may be made to JFETs 120 by back-side metallization layers 165. In the illustrated example, package level interconnects 166 are provided on or over a back-side of IC die 162 as bumps over passivation layer 155. However, package level interconnects 166 may have any characteristics discussed above.

In the illustrated example, back-side metallization layers 165 include BM1 and BM2. However, back-side metallization layers 165 may include any number of metallization layers such as two to five metallization layers. Front-side metallization layers 164 and back-side metallization layers 165 are embedded within dielectric materials 153, 154 of IC die 162.

Discussion now turns to circuit implementations using JFETs 120 and FinFETs 139. Notably, JFETs 120 may be deployed as n-type pull down transistors and FinFETs 139 may be deployed in constant current source circuitry.

Figure 3:
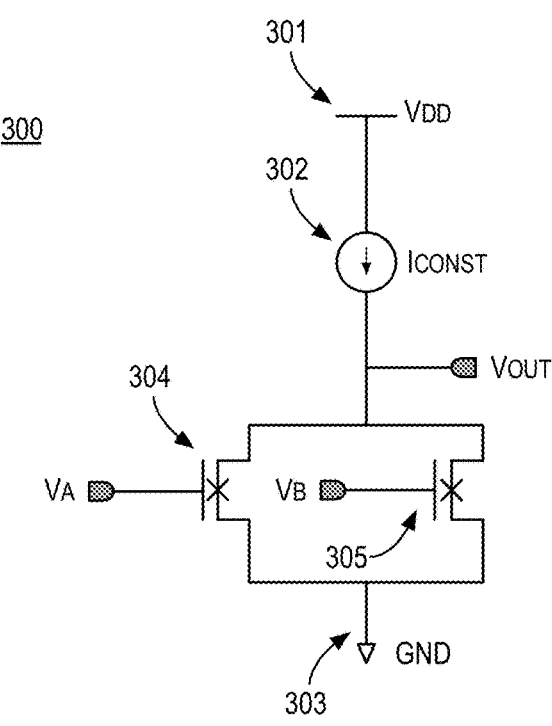
FIG. 3 illustrates a circuit diagram of an exemplary NOR gate circuit including pull down junction field effect transistors and a constant current module including a field effect transistor.

FIG. 3 illustrates a circuit diagram of an exemplary NOR gate circuit 300 including pull down junction field effect transistors 304, 305 and a constant current module 302 including a field effect transistor, arranged in accordance with at least some implementations of the present disclosure. In the context of FIGS. 3, 4, 5, 6A, and 6B, discussion is directed to fin field effect transistors for the sake of clarity. However, any metal oxide semiconductor field effect transistor architecture inclusive of planar or non-planar transistors structures may be deployed in the circuits of FIGS. 3, 4, 5, 6A, and 6B.

As shown, NOR gate circuit 300 includes a power or voltage source 301, a constant current circuit or module 302, pull down JFETs 304, 305, and a ground 303. Pull down JFETs 304, 305 may deploy JFETs 120, any corresponding components or structures, and any components or structures discussed with respect to JFET systems herein. Furthermore, constant current module 302 deploys any number (i.e., one or more) MOSFETs such as FinFETs 139, which may include any components or structures discussed herein. For example, NOR gate circuit 300 may be deployed in IC die 162 using JFETs 120 as pull down JFETs 304, 305 and FinFET 139 as a transistor in constant current module 302.

As shown, voltage source 301 provides a voltage (i.e., $V_{DD}$) to constant current module 302. Voltage source 301 may be an ultra low voltage source. In some embodiments, voltage source 301 provides a voltage $V_{DD}$ of not more than 50 mV. In some embodiments, voltage source 301 provides a voltage $V_{DD}$ of not more than 25 mV. In some embodiments, voltage source 301 provides a voltage $V_{DD}$ of not more than 10 mV. For example, constant current module 302 may be coupled to a power rail of metallization layers 164, 165, which provides the discussed voltage. Constant current module 302 deploys any number of MOSFETs such as FinFETs 139. Therefore, constant current module 302 may advantageously have a material system other than that of JFETs 120 such as a silicon channel based material system. Particularly at low temperatures, such material systems offer improved performance of the MOSFETs and therefore improved performance constant current module 302. Constant current module 302 may include any circuit architecture inclusive of dual NMOS FET with single resistor circuit designs, or others.

As shown, the constant current output ($I_{CONST}$ or $I_{BIAS}$) of constant current module 302 is provided to sources of pull down JFETs 304, 305 with the drains of pull down JFETs 304, 305 being coupled to ground 303. For example, ground 303 may be provided by a ground plane of metallization layers 164, 165 coupled to the drains of pull down JFETs 304, 305. The gates of pull down JFETs 304, 305 are coupled to input voltages $V_A$, $V_B$, respectively. An output voltage on a shared source line of the sources of pull down JFETs 304, 305 is provided as an output voltage $V_{OUT}$. For example, the interconnections of voltage source 301, constant current module 302, pull down JFETs 304, 305, ground 303, the input lines, and the output line may be metallization layers 164, 165. That is, NOR gate circuit 300 may be implemented as a portion of IC die 162. In operation, NOR gate circuit 300 receives to input voltages $V_A$, $V_B$ (or signals). When, both input signals are logical 0s (i.e., A=0, B=0), an output of 1 is provided; when both input signals are logical is (i.e., A=1, B=1) OR one input signal is 1 and the other is 0 (i.e., A=0, B=1 or A=1, B=0), an output of 0 is provided.

Figure 4:
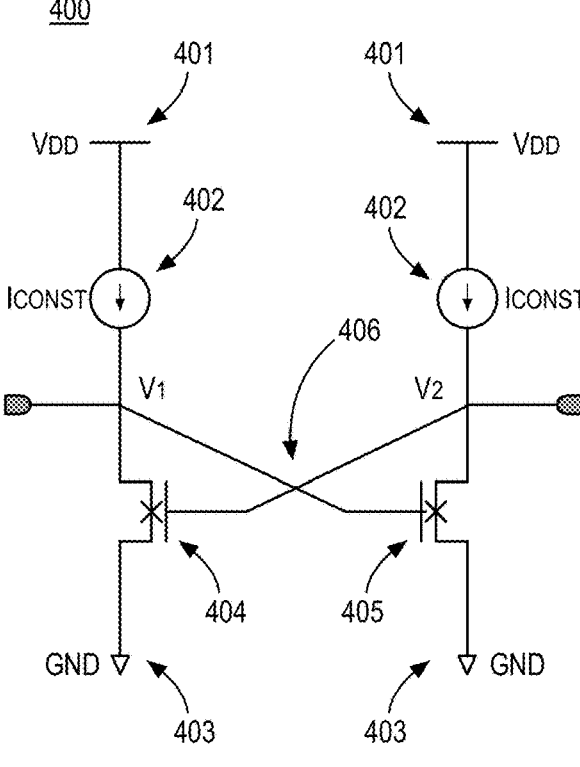
FIG. 4 illustrates a circuit diagram of an exemplary latch circuit including pull down junction field effect transistors and constant current modules each including a field effect transistor.

FIG. 4 illustrates a circuit diagram of an exemplary latch circuit 400 including pull down junction field effect transistors 404, 405 and constant current modules 402 each including a field effect transistor, arranged in accordance with at least some implementations of the present disclosure. Latch circuit 400 may be deployed in any context such as in an SRAM (static random-access memory) circuit. For example, latch circuit 400 may be an SRAM latch. In some embodiments, lath circuit 400 may be characterized as a flip-flop. As shown, latch circuit 400 includes power or voltage sources 401, constant current module 402, pull down JFETs 404, 405, and ground 403. Furthermore, pull down JFETs 404, 405 are cross-connected by connections 406. Pull down JFETs 404, 405 may deploy JFETs 120, any corresponding components or structures, and any components or structures discussed with respect to JFET systems herein. Furthermore, constant current modules 402 deploys any number (i.e., one or more) MOSFETs such as FinFETs 139, which may include any components or structures discussed herein. For example, latch circuit 400 may be deployed in IC die 162 using JFETs 120 as pull down JFETs 404, 405 and FinFET 139 as a transistor in constant current modules 402.

As shown, voltage sources 401 provide a voltage (i.e., $V_{DD}$) to constant current modules 402. Voltage sources 401 may provide any ultra low voltage discussed above with respect to voltage source 301. Constant current module 402 deploys any number of MOSFETs such as FinFETs 139 such that constant current module 402 may advantageously have a material system other than that of JFETs 120 such as a silicon channel based material system. The constant current outputs ($I_{CONST}$ or $I_{BIAS}$) of constant current modules 402 are provided to sources of pull down JFETs 404, 405 with the drains of pull down JFETs 404, 405 being coupled to grounds 403. The gates of pull down JFETs 404, 405 are cross coupled to input voltages $V_1$, $V_2$ also applied to the sources of the other one of pull down JFETs 404, 405. Thereby, latch circuit 400 may store a bit of information in, for example, an SRAM cell. In operation, a bit line and word line (not shown) may access latch circuit 400 to write a particular bit, read the bit, etc.

Figure 5:
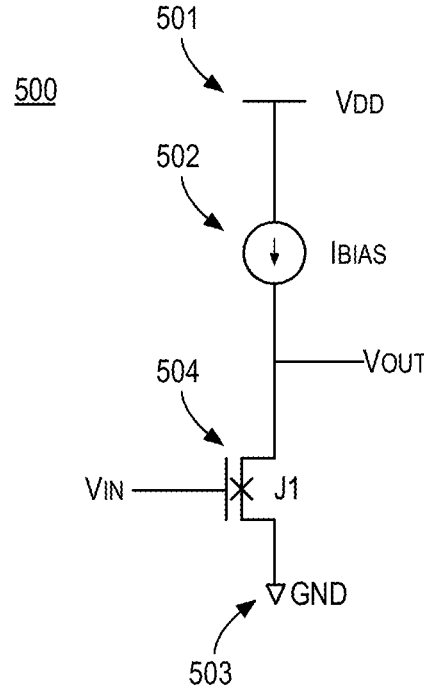
FIG. 5 illustrates a circuit diagram of an exemplary inverter circuit including a pull down junction field effect transistors and a constant current modules 502 including a field effect transistor.

FIG. 5 illustrates a circuit diagram of an exemplary inverter circuit 500 including a pull down junction field effect transistors 504 and a constant current modules 502 including a field effect transistor, arranged in accordance with at least some implementations of the present disclosure. For example, inverter circuit 500 may be a single stage inverter circuit, which may be deployed in any suitable context. As shown, inverter circuit 500 includes a power or voltage source 501, a constant current module 502, a pull down JFET 504 (J1), and ground 503. Pull down JFET 504 may deploy JFET 120, any corresponding components or structures, and any components or structures discussed with respect to JFET systems herein. Furthermore, constant current module 502 deploys any number (i.e., one or more) MOSFETs such as FinFETs 139, which may include any components or structures discussed herein. For example, inverter circuit 500 may be deployed in IC die 162 using JFET 120 as pull down JFET 504 and FinFET 139 as a transistor in constant current module 502.

Voltage source 501 provides a voltage (i.e., $V_{DD}$) to constant current modules 502. Voltage source 501 may provide any ultra low voltage as discussed above. Constant current module 502 deploys any number of MOSFETs such as FinFETs 139. The constant current outputs ($I_{CONST}$ or $I_{BIAS}$) of constant current module 502 are provided to a source of pull down JFET 504 with the drain of pull down JFET 504 being coupled to ground 503. The gate of pull down JFET 504 is coupled to an input voltage $V_{IN}$ while an output voltage $V_{OUT}$ from the source line of JFET 504 is provided as an output of inverter circuit 500. In operation, inverter circuit 500 receives to input voltage $V_{IN}$ (or input signal) and inverts it to an output signal or voltage $V_{OUT}$. For example, when $V_{IN}$ is a logical 1 is an output of logical 0 is provided and vice versa. Although any electrical characteristics may be deployed, in some embodiments, input voltage $V_{IN}$ is 0-10 mV, the threshold voltage Vt of JFET 504 is –1.2 mV and the constant current $I_{BIAS}$ is in the range of 2 to 2.5 uA with 2.18 uA being particularly advantageous.

Figure 6A:
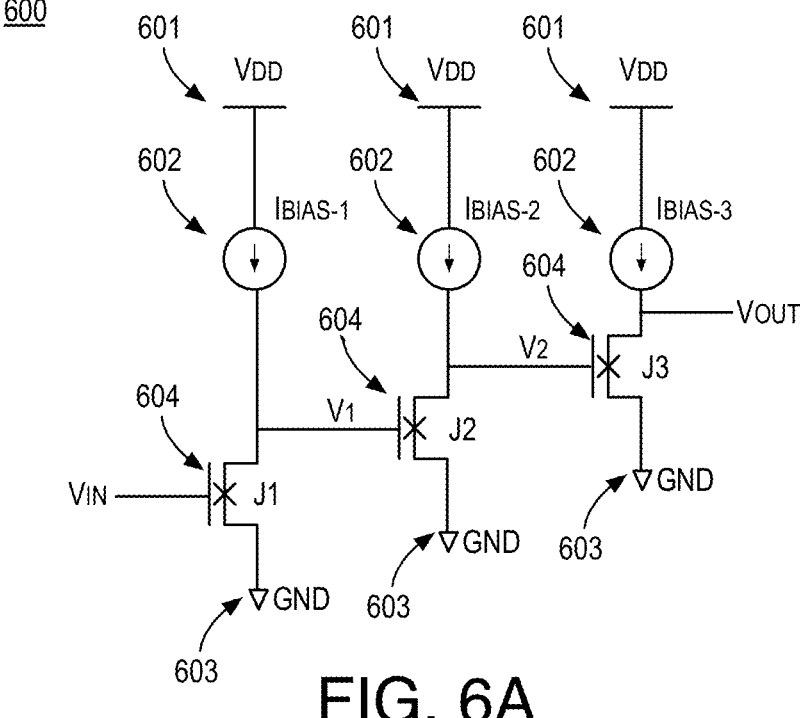
FIG. 6A illustrates a circuit diagram of an exemplary three-stage inverter circuit including three pull down junction field effect transistors and three constant current modules each including a field effect transistor.
Figure 6B:
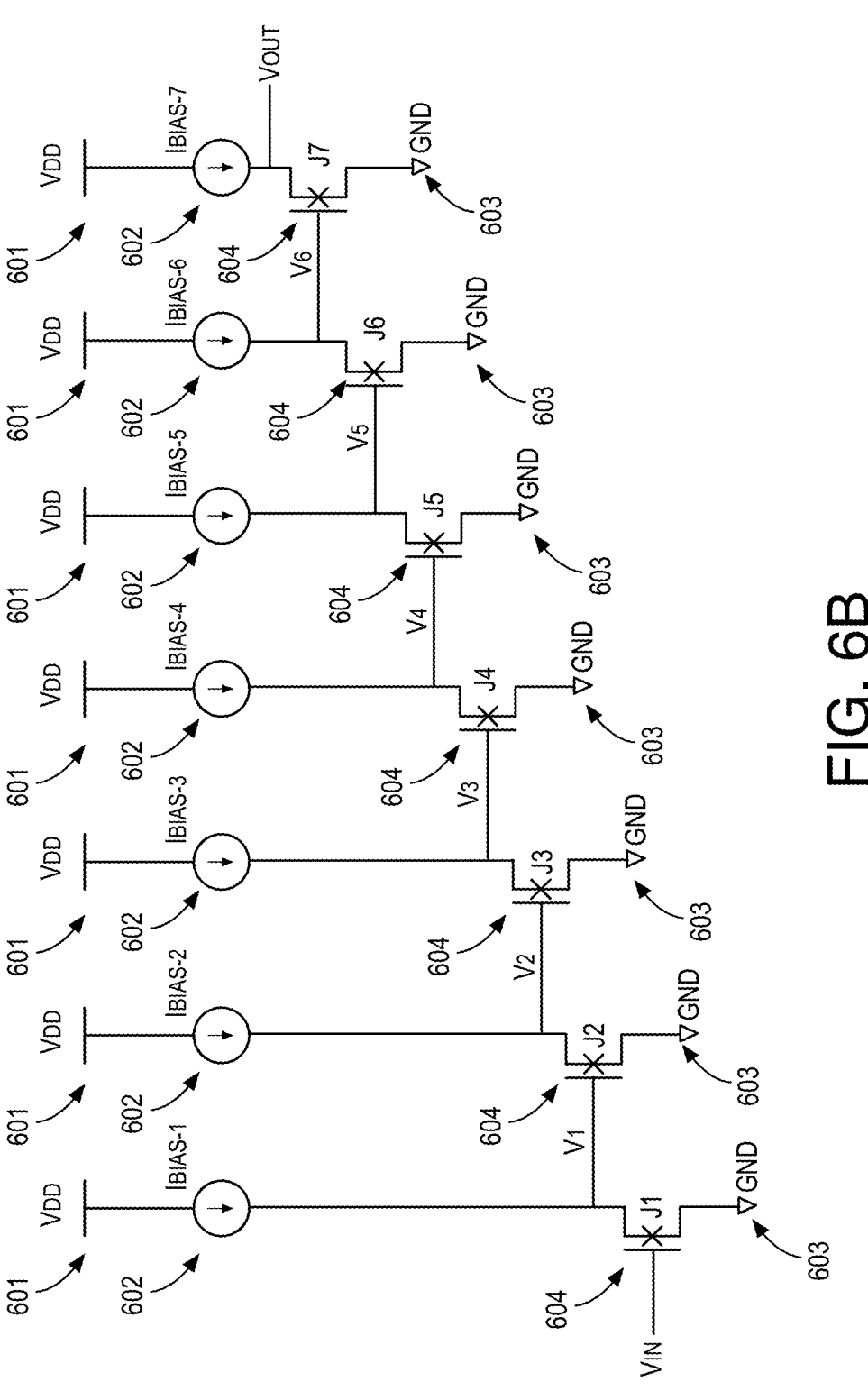
FIG. 6B illustrates a circuit diagram of an exemplary multi-stage inverter circuit including multiple pull down junction field effect transistors and multiple constant current modules each including a field effect transistor.

FIG. 6A illustrates a circuit diagram of an exemplary three-stage inverter circuit 600 including three pull down junction field effect transistors 604 and three constant current modules 602 each including a field effect transistor, arranged in accordance with at least some implementations of the present disclosure. FIG. 6B illustrates a circuit diagram of an exemplary multi-stage inverter circuit 610 including multiple pull down junction field effect transistors 604 and multiple constant current modules 602 each including a field effect transistor, arranged in accordance with at least some implementations of the present disclosure. For example, multi-stage inverter circuit 610 may include any number of stages for improved performance (i.e., $V_{IN}$ to $V_{OUT}$ ratio). In the example of FIG. 6B, seven stages are illustrated for exemplary purposes; however, fewer or more stages may be deployed. In the example, of FIG. 6A, three-stage inverter circuit 600 is illustrated as another exemplary multi-stage inverter.

As shown in FIG. 6A, three-stage inverter circuit 600 includes power or voltage sources 601, three constant current modules 602 (to provide three constant currents: $I_{BIAS-1}$, $I_{BIAS-2}$, $I_{BIAS-3}$), three pull down JFETs 604 (J1, J2, J3), and grounds 603. Pull down JFETs 604 may deploy JFETs 120, any corresponding components or structures, and any components or structures discussed with respect to JFET systems herein. Furthermore, constant current modules 602 deploys any number (i.e., one or more) MOSFETs such as FinFETs 139, which may include any components or structures discussed herein. For example, three-stage inverter circuit 600 may be deployed in IC die 162 using JFET 120 as pull down JFETs 604 and FinFET 139 as a transistor in constant current modules 602.

Voltage sources 601 provides a voltage (i.e., $V_{DD}$) to constant current modules 602. Voltage sources 601 may provide any ultra low voltage as discussed above. Constant current modules 602 deploy any number of MOSFETs such as FinFETs 139. The constant current outputs ($I_{BIAS-1}$, $I_{BIAS-2}$, $I_{BIAS-3}$) of constant current modules 602 are provided, respectively, to sources of pull down JFETs 604 with the drains of pull down JFETs 604 being coupled to grounds 603. The gate of the first pull down JFET 604 (J1) is coupled to an input voltage $V_{IN}$ while an output voltage $V_1$ from the source line of the first pull down JFET 604 (J1) is provided to the gate of the second pull down JFET 604 (J2). The output voltage $V_2$ from the source line of the second pull down JFET 604 (J2) is provided to the gate of the third pull down JFET 604 (J3). The output voltage $V_{OUT}$ from the source line of the third pull down JFET 604 (J4) is provided as an output of three-stage inverter circuit 600. In operation, three-stage inverter circuit 600 receives to input voltage $V_{IN}$ (or input signal) and inverts it to an output signal or voltage $V_{OUT}$, as discussed above. Although any electrical characteristics may be deployed, in some embodiments, input voltage $V_{IN}$ is 0-10 mV, the threshold voltage of JFETs 604 Vt is –1.2 mV, the constant currents of $I_{BIAS-1}$ and $I_{BIAS-1}$ are in the range of 2 to 2.5 uA with 2.18 uA being particularly advantageous, and the constant current of $I_{BIAS-2}$ is in the range of 1.25 to 1.65 uA with 1.45 uA being particularly advantageous.

Similarly, as shown in FIG. 6B, multi-stage inverter circuit 610 includes power or voltage sources 601, any number of constant current modules 602 (such as seven, to provide three constant currents: $I_{BIAS-1}$, $I_{BIAS-2}$, $I_{BIAS-3}$, qj $I_{BIAS-4}$, $I_{BIAS-5}$, $I_{BIAS-6}$, $I_{BIAS-7}$), any number of pull down JFETs 604 (such as seven: J1, J2, J3, J4, J5, J6, J7), and grounds 603. For example, multi-stage inverter circuit 610 may be deployed in IC die 162 using JFET 120 as pull down JFETs 604 and FinFET 139 as a transistor in constant current modules 602.

As shown, the constant current outputs ($I_{BIAS-1}$, $I_{BIAS-2}$, $I_{BIAS-3}$, $I_{BIAS-4}$, $I_{BIAS-5}$, $I_{BIAS-6}$, $I_{BIAS-7}$) of constant current modules 602 are provided, respectively, to sources of pull down JFETs 604 with the drains of pull down JFETs 604 being coupled to grounds 603. The gate of the first pull down JFET 604 (J1) is coupled to an input voltage $V_{IN}$ while an output voltage $V_1$ from the source line of the first pull down JFET 604 (J1) is provided to the gate of the second pull down JFET 604 (J2). The output voltage $V_2$ from the source line of the second pull down JFET 604 (J2) is provided to the gate of the third pull down JFET 604 (J3), the output voltage $V_3$ from the source line of the third pull down JFET 604 (J3) is provided to the gate of the fourth pull down JFET 604 (J4), and so on in a cascading fashion. The output voltage $V_{OUT}$ from the source line of the final pull down JFET 604 (JN, with N being 7 in this example) is provided as an output of multi-stage inverter circuit 610. In operation, multi-stage inverter circuit 610 receives to input voltage $V_{IN}$ (or input signal) and inverts it to an output signal or voltage $V_{OUT}$, as discussed above. Although any electrical characteristics may be deployed, in some embodiments, input voltage $V_{IN}$ is 0-10 mV, the threshold voltage of JFETs 604 Vt is –1.2 mV, the constant currents of $I_{BIAS-1,3,4,6}$ are in the range of 2 to 2.5 uA with 2.18 uA being particularly advantageous, and the constant currents of $I_{BIAS-2,5,7}$ are in the range of 1.25 to 1.65 uA with 1.45 uA being particularly advantageous. As discussed, any number of stages may be deployed such as four to seven, or more.

As discussed the circuits and systems of the present embodiments may advantageously be deployed at very low temperatures (i.e., at or below 0° C.). Discussion now turns to exemplary very low temperature systems.

Figure 7:
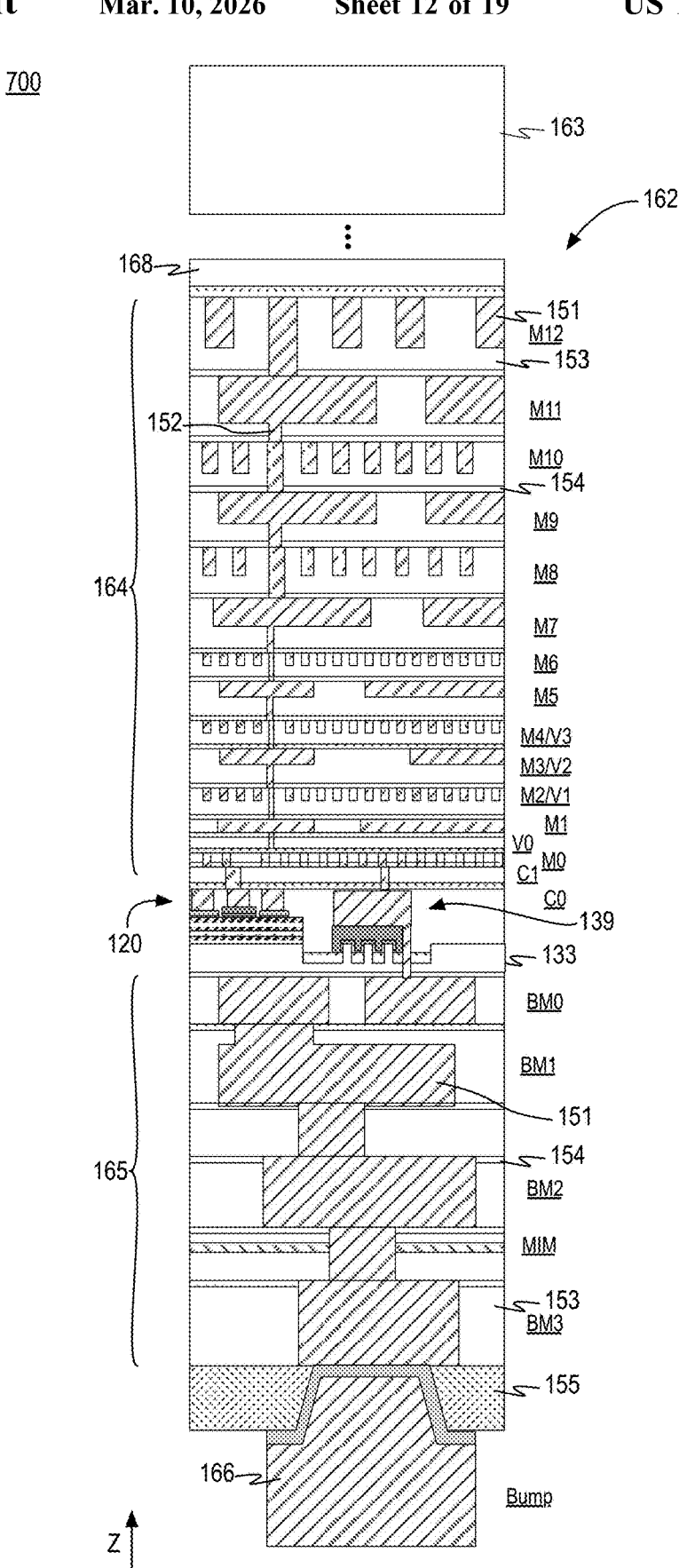
FIG. 7 illustrates a cross-sectional view of an integrated junction field effect transistor and fin field effect transistor integrated circuit system for implementation at very low temperature.

FIG. 7 illustrates a cross-sectional view of an integrated junction field effect transistor and fin field effect transistor integrated circuit system 700 for implementation at very low temperature, arranged in accordance with at least some implementations of the present disclosure. As shown, IC system 700 includes IC die 162, which is a monolithic integrated circuit. In FIG. 7, IC die 162 of FIG. 1J is used exemplary. However, IC die 162 may include IC die 162 of FIG. 2E or an IC die including only JFET 120. IC die 162 includes JFETs 120, FinFETs 139, front-side metallization layers 164, and back-side metallization layers 165. IC system 700 further includes a package level cooling structure 163, which may be deployed on or over front-side metallization layers 164 (as shown) or on or over a back-side of IC die 162. In some embodiments, package level cooling structure 163 is coupled to IC die 162 by an adhesion layer 168. Notably, IC system 700 may be deployed without back-side metallization layers 165.

IC system 700 includes IC die 162 and an active cooling structure operable to remove heat from IC die 162 to achieve a very low operating temperature of IC die 162. As used herein, the term very low operating temperature indicates a temperature at or below 0° C., although even lower temperatures such as an operating temperature at or below −50° C., an operating temperature at or below −70° C., an operating temperature at or below −100° C., an operating temperature at or below −180° C., or an operating temperature at or below −196° C. may be used. In some embodiments, the operating temperature is in a cryogenic temperature operating window (e.g., about −180° C. to about −70° C.). The active cooling structure may be provided as a package level structure (i.e., separable from IC die 162) as shown with respect to package level cooling structure 163, as a die level structure (i.e., integral to IC die 162), or both. In some embodiments, an active cooling structure is not needed as IC die 162 is deployed in a sufficiently cold environment. IC die 162 includes JFETs 120 and/or FinFETs 139 (or other FETs) having any characteristics discussed herein.

Figure 8:
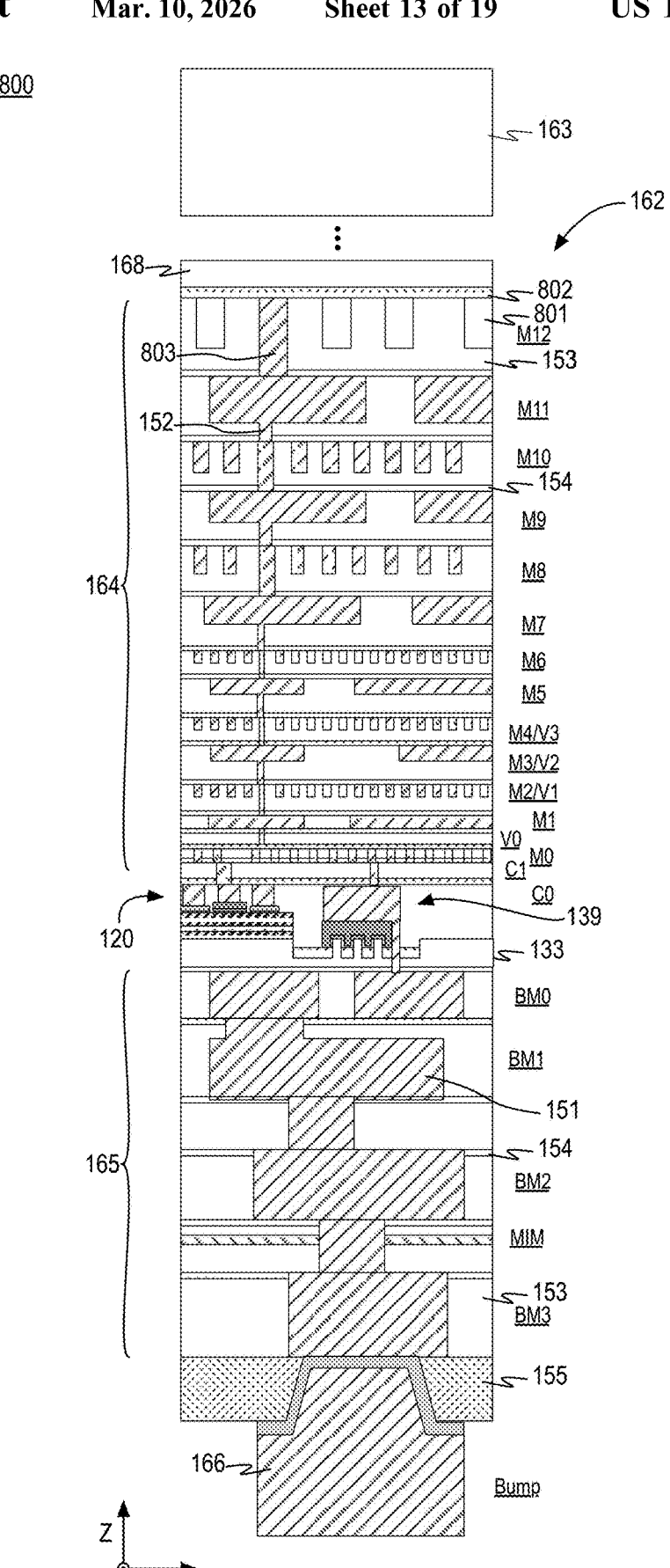
FIG. 8 illustrates a cross-sectional view of a low temperature integrated junction field effect transistor and fin field effect transistor integrated circuit system using die level cooling.

FIG. 8 illustrates a cross-sectional view of a low temperature integrated junction field effect transistor and fin field effect transistor integrated circuit system 800 using die level cooling, arranged in accordance with at least some implementations of the present disclosure. In FIG. 8 and elsewhere herein, like numerals are used to indicate like structures or components that may have any characteristics discussed elsewhere herein. In the example of IC system 800, IC die 162 includes active cooling structures or components to remove heat from IC die 162 to achieve an operating temperature of IC die 162 at or below a target temperature such as 0° C. or any other operating or target temperature discussed herein.

In IC system 800, IC die 162 includes die level active cooling as provided by microchannels 801. Microchannels 801 are to convey a heat transfer fluid therein to remove heat from IC die 162. The heat transfer fluid may be any suitable liquid or gas. In some embodiments, the heat transfer fluid is liquid nitrogen operable to lower the temperature of IC die to a temperature at or below about −196° C. In some embodiments, the heat transfer fluid is a fluid with a cryogenic temperature operating window (e.g., about −180° C. to about −70° C.). In some embodiments, the heat transfer fluid is one of helium-3, helium-4, hydrogen, neon, air, fluorine, argon, oxygen, or methane.

As used herein, the term microchannels indicates a channel to convey a heat transfer fluid with the multiple microchannels providing discrete separate channels or a network of channels. Notably, the plural microchannels does not indicate separate channel networks are needed. Such microchannels 801 may be provided in any pattern in the x-y plane such as serpentine patterns, patterns of multiple parallel microchannels 801, or the like. Microchannels 801 couple to a heat exchanger (not shown) that removes heat from and cools the heat transfer fluid before re-introduction to microchannels 801. The flow of fluid within microchannels 801 may be provided by a pump or other fluid flow device. The operation of the heat exchanger, pump, etc. may be controlled by a controller.

In the illustrated embodiment, microchannels 801 are implemented at metallization level M12. In other embodiments, microchannels 801 are implemented over metallization level M12. Microchannels 801 may be formed using any suitable technique or techniques such as patterning and etch techniques to form the void structures of microchannels 801 and passivation or deposition techniques to form a cover structure 802 to enclose the void structures. As shown, in some embodiments, the active cooling structure of IC system 800 includes a number of microchannels 801 in IC die 162 and over a number of front-side metallization layers 164. As discussed, microchannels 801 are to convey a heat transfer fluid therein.

In some embodiments, a metallization feature 803 of metallization layer M12 is laterally adjacent to microchannels 801. For example, metallization feature 803 may couple to a package level interconnect structure (not shown) for signal routing for IC die 162. In the example of IC system 800, package level cooling structure 163 may be a passive heat removal device such as a heat sink or the like. In some embodiments, package level cooling structure 163 is not deployed in IC system 800.

Figure 9:
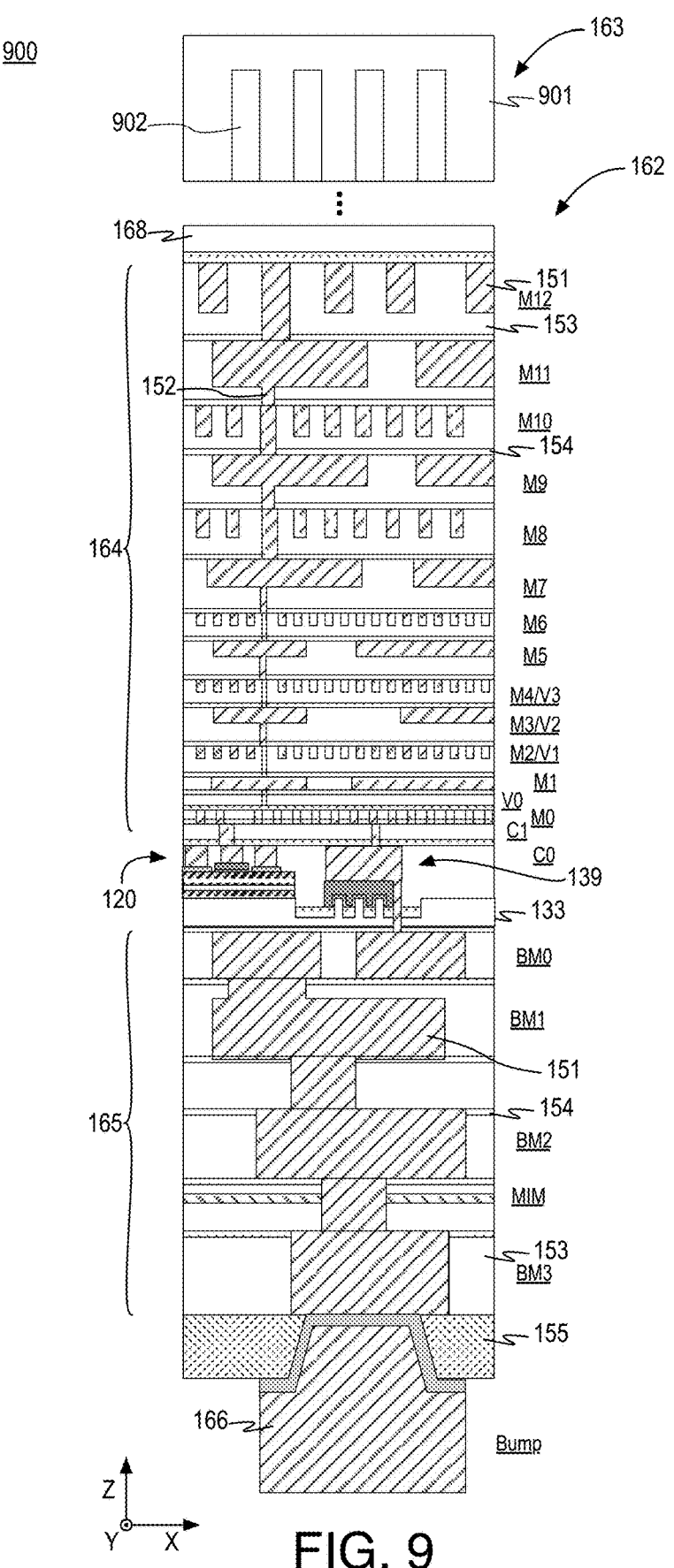
FIG. 9 illustrates a cross-sectional view of a low temperature integrated junction field effect transistor and fin field effect transistor integrated circuit system using package level cooling.

FIG. 9 illustrates a cross-sectional view of a low temperature integrated junction field effect transistor and fin field effect transistor integrated circuit system 900 using package level cooling, arranged in accordance with at least some implementations of the present disclosure. In the example of IC system 900, IC die 162 includes active cooling structures or components to remove heat from IC die 162 to achieve an operating temperature of IC die 162 at or below a target temperature such as 0° C. or any other operating or target temperature discussed herein.

In IC system 900, package level cooling structure 163 includes an active cooling structure 901 having microchannels 902. Microchannels 902 are to convey a heat transfer fluid therein to remove heat from IC die 162. The heat transfer fluid may be any suitable liquid or gas as discussed with respect to FIG. 8. Microchannels 902 may be provided in any pattern in the x-y plane such as serpentine patterns, patterns of multiple parallel microchannels 902, etc. Microchannels 902 couple to a heat exchanger (not shown) that removes heat from and cools the heat transfer fluid before re-introduction to microchannels 902. The flow of fluid within microchannels 902 may be provided by a pump or other fluid flow device. The operation of the heat exchanger, pump, etc. may be controlled by a controller. In the illustrated embodiment, active cooling structure 901 is a chiller mounted to IC die 162 such that the chiller has a solid body having microchannels therein to convey a heat transfer fluid.

Figure 10:
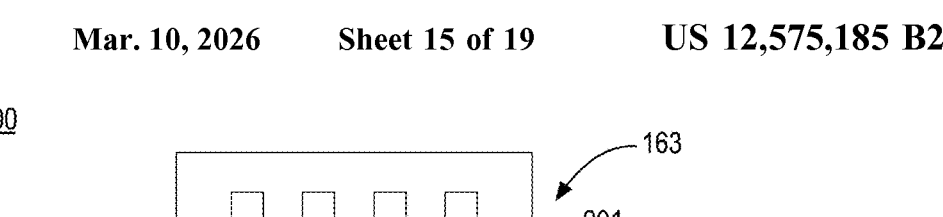
FIG. 10 illustrates a cross-sectional view of a low temperature integrated junction field effect transistor and fin field effect transistor integrated circuit system using die level and package level cooling.

FIG. 10 illustrates a cross-sectional view of a low temperature integrated junction field effect transistor and fin field effect transistor integrated circuit system 1000 using die level and package level cooling, arranged in accordance with at least some implementations of the present disclosure. In the example of IC system 1000, IC die 162 includes active cooling structures or components as provided by both microchannels 801 and active cooling structure 901.

In some embodiments, the heat removal fluid deployed in microchannels 801 and active cooling structure 901 are coupled to the same pump and heat exchanger systems. In such embodiments, the heat removal fluid conveyed in both microchannels 801 and active cooling structure 901 are the same material. Such embodiments may advantageously provide simplicity. In other embodiments, the heat removal fluids are controlled separately. In such embodiments, the heat removal fluids conveyed by microchannels 801 and active cooling structure 901 may be the same or they may be different. Such embodiments may advantageously provide improved flexibility.

Figure 11:
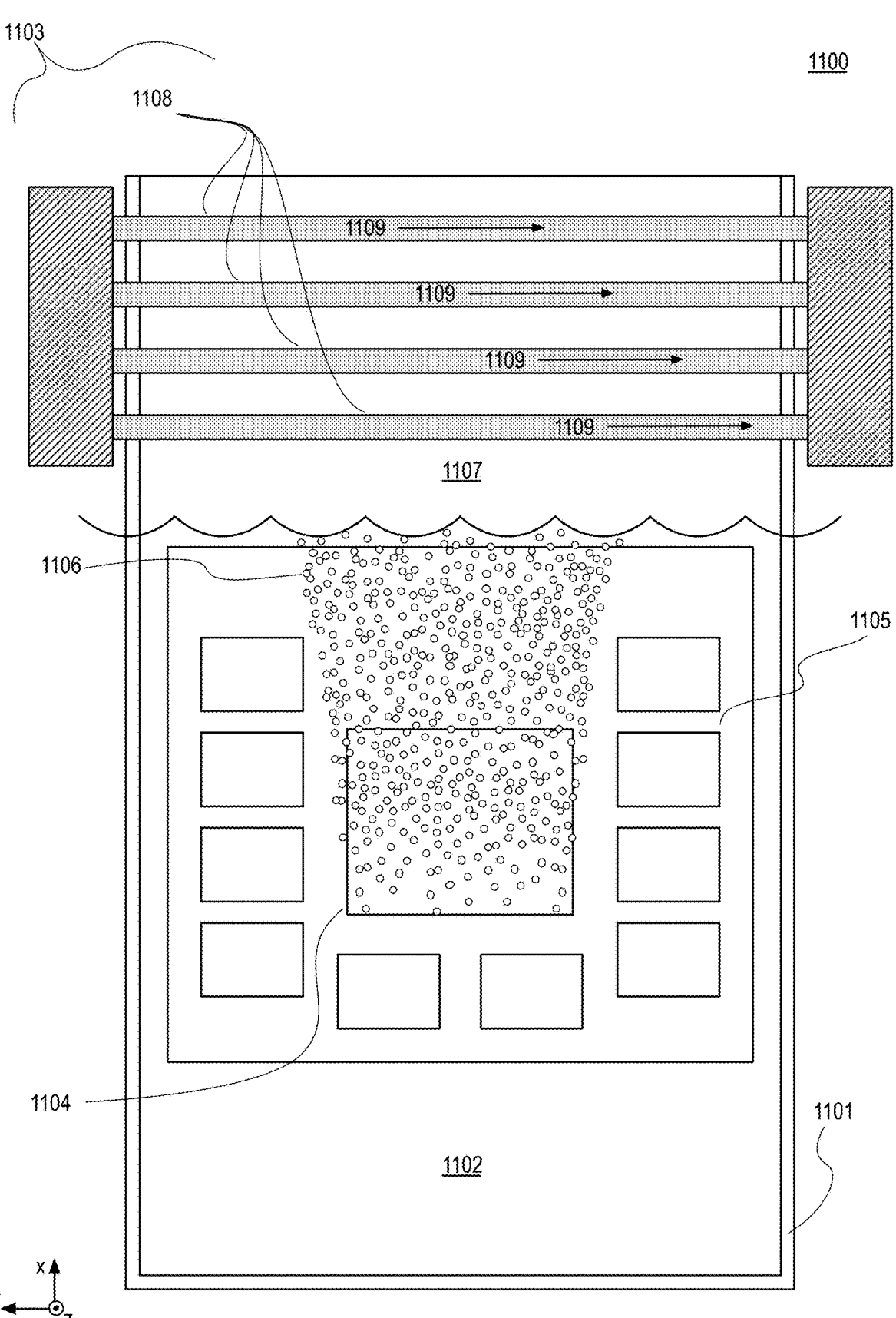
FIG. 11 illustrates a view of an example two-phase immersion cooling system for low temperature operation of an integrated circuit die having integrated junction field effect transistors and fin field effect transistors.

FIG. 11 illustrates a view of an example two-phase immersion cooling system 1100 for low temperature operation of an integrated circuit die having integrated junction field effect transistors and fin field effect transistors, arranged in accordance with at least some implementations of the present disclosure. As shown, two-phase immersion cooling system 1100 includes a fluid containment structure 1101, a low-boiling point liquid 1102 within fluid containment structure 1101, and a condensation structure 1103 at least partially within fluid containment structure 1101. As used herein, the term low-boiling point liquid indicates a liquid having a boiling point in the very low temperature ranges discussed. In some embodiments, the low-boiling point liquid is one of helium-3, helium-4, hydrogen, neon, air, fluorine, argon, oxygen, or methane.

In operation, a heat generation source 1104, such as an IC package including any of IC systems 800 900, 1000 as discussed herein is immersed in low-boiling point liquid 1102. In some embodiments, IC systems 800, 900, 1000 as deployed in two-phase immersion cooling system 1100 do not include additional active cooling structures, although such die level or package level active cooling structures may be used in concert with two-phase immersion cooling system 1100. In some embodiments, when deployed in two-phase immersion cooling system 1100, package level cooling structure 163 is a heat sink, a heat dissipation plate, a porous heat dissipation plate or the like.

Notably, IC die 162, deploying one or more functional circuit blocks having non-planar transistors all of a single conductivity type is the source of heat in the context of two-phase immersion cooling system 1100. For example, IC die 162 may be packaged and mounted on electronics substrate 1105. Electronic substrate 1105 may be coupled to a power supply (not shown) and may be partially or completely submerged in low-boiling point liquid 1102.

In operation, the heat produced by heat generation source 1104 vaporizes low-boiling point liquid 1102 as shown in vapor or gas state as bubbles 1106, which may collect, due to gravitational forces, above low-boiling point liquid 1102 as a vapor portion 1107 within fluid containment structure 1101. Condensation structure 1103 may extend through vapor portion 1107. In some embodiments, condensation structure 1103 is a heat exchanger having a number of tubes 1108 with a cooling fluid (i.e., a fluid colder than the condensation point of vapor portion 1107) shown by arrows 1109 that may flow through tubes 1108 to condense vapor portion 1107 back to low-boiling point liquid 1102. In the IC system of FIG. 11, package level cooling structure 163 includes a passive cooling structure such as a heat sink for immersion in low-boiling point liquid 1102.

FIG. 12 is a flow diagram illustrating an example process 1200 for forming a low temperature integrated junction field effect transistor and fin field effect transistor integrated circuit system, arranged in accordance with at least some implementations of the present disclosure. As shown, process 1200 begins at operation 1201, where a workpiece or substrate is received for processing. The substrate may be any substrate discussed herein with respect to substrate 101. In some embodiments, the substrate is an indium phosphide wafer.

Processing continues at operation 1202, where a JFET is formed on a buffer layer over the substrate. In some embodiments, a graded buffer layer is formed on the substrate such that the graded buffer layer is $In_xAl_{1-x}As$ having a lower indium composition adjacent the substrate and a higher indium composition opposite or distal from the substrate. A constant composition buffer layer may then be formed on the buffer layer such as an $In_xAl_{1-x}As$ buffer layer having the indium composition of the graded buffer layer opposite or distal from the substrate. A multi-layer quantum well channel is then formed on the constant composition buffer layer such that the multi-layer quantum well channel includes a first barrier layer (e.g., $In_xGa_{1-x}As$) on the constant composition buffer layer, a well layer (e.g., InAs) on the first barrier layer, and a second barrier layer (e.g., $In_xGa_{1-x}As$) on the well layer. The graded buffer layer, constant composition buffer layer, and multi-layer quantum well channel may all be crystalline material layers, for example. A source and a drain and a gate structure are then formed on the second barrier layer. In some embodiments, the source and drain are advantageously pure, pure, or completely pure crystalline indium arsenide. In some embodiments, the gate structure includes a gate dielectric on the second barrier layer and a gate electrode on the gate dielectric. In some embodiments, the gate dielectric is advantageously hafnium oxide that is less than about 8 nm in thickness.

Processing continues at operation 1203, where a carrier wafer is attached to a layer over the JFET. The layer over the JFET may be any suitable protective layer and the carrier wafer may be attached to the layer using any suitable technique or techniques. Processing continues at operation 1204, where a back-side grid, back-side etch, and/or other processing is performed to remove the substrate received at operation 1201 and to remove at least a portion of the constant composition buffer layer and/or graded buffer layer formed at operation 1202. In some embodiments, such processing exposes the first barrier layer of the multi-layer quantum well channel. Processing continues at operation 1205, where the exposed layer of the multi-layer quantum well channel or any remaining portion of the buffer layer (i.e., constant composition buffer layer or graded buffer layer) is coupled to a second substrate such as a silicon substrate.

Processing continues at operation 1206, where a FET such as a FinFET is formed using the silicon substrate. The FET may be formed using any techniques discussed herein such as those discussed with respect to FIGS. 1F-1I or those discussed with respect to FIGS. 2A-2E. The FET may be a planar FET or a non-planar FET. In some embodiments, operation 1206 includes removing a portion of a multi-layer stack including the crystalline well layer, and the first and second crystalline barrier layers to expose a region of the silicon substrate, and forming the FET on the exposed region, such that the FET includes a silicon fin having a channel region, and a gate structure between a source and a drain with the gate structure, source, and drain coupled to the fin. In some embodiments, operation 1206 includes thinning the silicon substrate opposite the JFET to expose a region of the silicon substrate, and forming FET on the exposed region, such that the FET includes a silicon fin having a channel region, and a gate structure between a source and a drain with the gate structure, source, and drain coupled to the fin.

Processing continues at operation 1207, where a number of metallization layers are formed over a front-side and/or a back-side of the JFET and FET. The front-side metallization layers and back-side metallization may be formed using any suitable technique or techniques such as dual damascene techniques, single damascene techniques, subtractive metallization patterning techniques, or the like. In some embodiments, front- or back-side metallization processing may include supporting the workpiece using a carrier wafer.

Processing continues at operation 1208, where an active cooling structure operable to remove heat from the functional circuit block to achieve an operating temperature at or below 0° C. is provided. Any active cooling structure discussed herein may be provided at operation 1208. For example, die level active cooling may be formed by etching the void structures of the microchannels followed by deposition techniques to enclose the void structures. For example, microchannels 801 to convey a heat transfer fluid therein may be formed at operation 1208. In addition or in the alternative, a package level active cooling structure is provided. In some embodiments, active cooling structure 901 having microchannels 902 may be separately formed and attached to an IC die separated from a wafer. For example, the wafer may be diced, each IC die may be packaged and an active cooling structure 901 may be attached thereto. In some embodiments, a two-phase immersion cooling system as discussed with respect to FIG. 11 is provided as the package level active cooling structure. Processing ends at operation 1209 where the resultant device or system is output for use. As discussed, the active cooling structure is operable to maintain a very low temperature for the IC die for improved performance.

Figure 13:
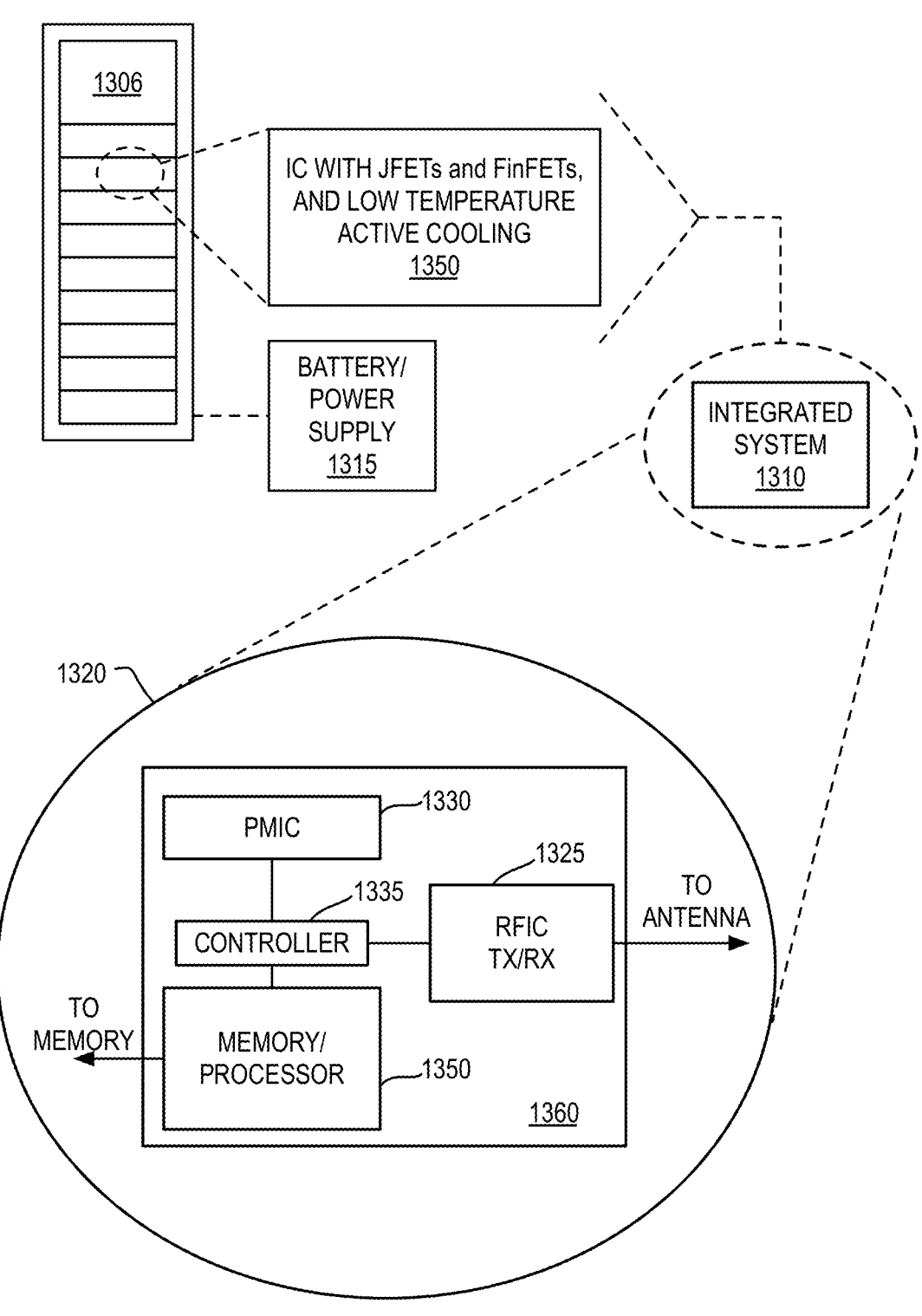
FIG. 13 illustrates diagram of an example data server machine employing a low temperature junction field effect transistor integrated circuit system.

FIG. 13 illustrates diagram of an example data server machine 1306 employing a low temperature integrated junction field effect transistor and fin field effect transistor integrated circuit system, arranged in accordance with at least some implementations of the present disclosure. Server machine 1306 may be any commercial server, for example, including any number of high-performance computing platforms disposed within a rack and networked together for electronic data processing, which in the exemplary embodiment includes one or more devices 1350 having an integrated circuit with JFETs and FinFETs (or other FETS), and low temperature active cooling operable to remove heat from the integrated circuit to achieve any low operating temperature discussed herein.

Also as shown, server machine 1306 includes a battery and/or power supply 1315 to provide power to devices 1350, and to provide, in some embodiments power delivery functions such as power regulation. Devices 1350 may be deployed as part of a package-level integrated system 1310. Integrated system 1310 is further illustrated in the expanded view 1320. In the exemplary embodiment, devices 1350 (labeled "Memory/Processor") includes at least one memory chip (e.g., RAM), and/or at least one processor chip (e.g., a microprocessor, a multi-core microprocessor, or graphics processor, or the like) having the characteristics discussed herein. In an embodiment, device 1350 is a microprocessor including an SRAM cache memory. As shown, device 1350 may employ a die or device having any transistor structures and/or related characteristics discussed herein. Device 1350 may be further coupled to (e.g., communicatively coupled to) a board, a substrate, or an interposer 1360 along with, one or more of a power management integrated circuit (PMIC) 1330, RF (wireless) integrated circuit (RFIC) 1325 including a wideband RF (wireless) transmitter and/or receiver (TX/RX) (e.g., including a digital baseband and an analog front end module further comprises a power amplifier on a transmit path and a low noise amplifier on a receive path), and a controller 1335 thereof.

Figure 14:
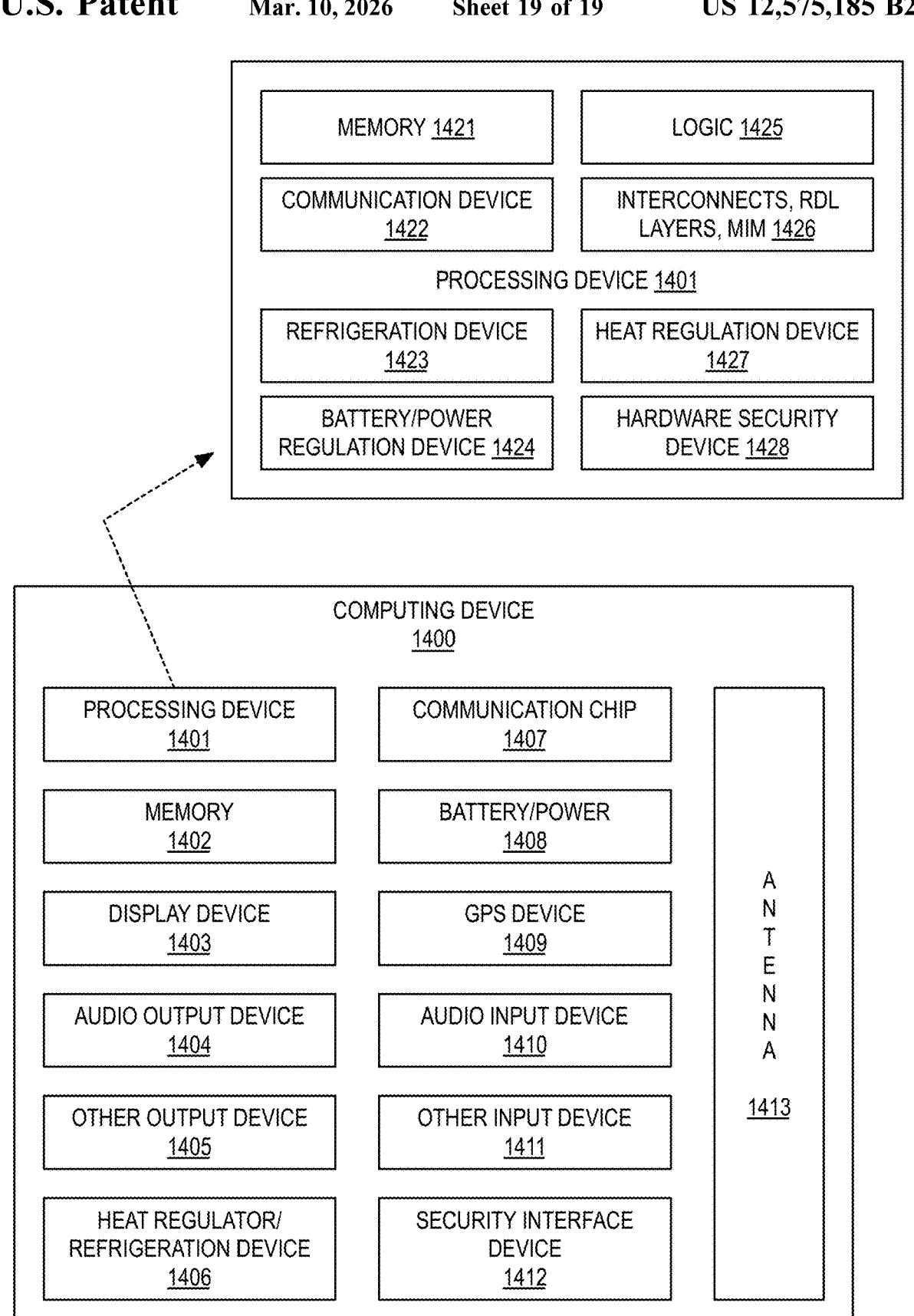
FIG. 14 is a block diagram of an example computing device, all arranged in accordance with at least some implementations of the present disclosure.

FIG. 14 is a block diagram of an example computing device 1400, arranged in accordance with at least some implementations of the present disclosure. For example, one or more components of computing device 1400 may include any of the devices or structures discussed herein. A number of components are illustrated in FIG. 14 as being included in computing device 1400, but any one or more of these components may be omitted or duplicated, as suitable for the application. In some embodiments, some or all of the components included in computing device 1400 may be attached to one or more printed circuit boards (e.g., a motherboard). In some embodiments, various ones of these components may be fabricated onto a single system-on-a-chip (SoC) die. Additionally, in various embodiments, computing device 1400 may not include one or more of the components illustrated in FIG. 14, but computing device 1400 may include interface circuitry for coupling to the one or more components. For example, computing device 1400 may not include a display device 1403, but may include display device interface circuitry (e.g., a connector and driver circuitry) to which display device 1403 may be coupled. In another set of examples, computing device 1400 may not include an audio output device 1404, other output device 1405, global positioning system (GPS) device 1409, audio input device 1410, or audio input device 1411, but may include audio output device interface circuitry, other output device interface circuitry, GPS device interface circuitry, audio input device interface circuitry, audio input device interface circuitry, to which audio output device 1404, other output device 1405, GPS device 1409, audio input device 1410, or audio input device 1411 may be coupled.

Computing device 1400 may include a processing device 1401 (e.g., one or more processing devices). As used herein, the term processing device or processor indicates a device that processes electronic data from registers and/or memory to transform that electronic data into other electronic data that may be stored in registers and/or memory. Processing device 1401 may include a memory 1421, a communication device 1422, a refrigeration device 1423, a battery/power regulation device 1424, logic 1425, interconnects 1426 (i.e., optionally including redistribution layers (RDL) or metal-insulator-metal (MIM) devices), a heat regulation device 1427, and a hardware security device 1428.

Processing device 1401 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

Computing device 1400 may include a memory 1402, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, memory 1402 includes memory that shares a die with processing device 1401. This memory may be used as cache memory and may include embedded dynamic random-access memory (eDRAM) or spin transfer torque magnetic random-access memory (STT-M RAM).

Computing device 1400 may include a heat regulation/refrigeration device 1406. Heat regulation/refrigeration device 1406 may maintain processing device 1401 (and/or other components of computing device 1400) at a predetermined low temperature during operation. This predetermined low temperature may be any temperature discussed herein.

In some embodiments, computing device 1400 may include a communication chip 1407 (e.g., one or more communication chips). For example, the communication chip 1407 may be configured for managing wireless communications for the transfer of data to and from computing device 1400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 1407 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. Communication chip 1407 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication chip 1407 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 1407 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 1407 may operate in accordance with other wireless protocols in other embodiments. Computing device 1400 may include an antenna 1413 to facilitate wireless communications and/or to receive other wireless communications (such as AM or FM radio transmissions).

In some embodiments, communication chip 1407 may manage wired communications, such as electrical, optical, or any other suitable communication protocols (e.g., the Ethernet). As noted above, communication chip 1407 may include multiple communication chips. For instance, a first communication chip 1407 may be dedicated to shorter-range wireless communications such as Wi-Fi or Bluetooth, and a second communication chip 1407 may be dedicated to longer-range wireless communications such as GPS, EDGE, GPRS, CDMA, WiMAX, LTE, EV-DO, or others. In some embodiments, a first communication chip 1407 may be dedicated to wireless communications, and a second communication chip 1407 may be dedicated to wired communications.

Computing device 1400 may include battery/power circuitry 1408. Battery/power circuitry 1408 may include one or more energy storage devices (e.g., batteries or capacitors) and/or circuitry for coupling components of computing device 1400 to an energy source separate from computing device 1400 (e.g., AC line power).

Computing device 1400 may include a display device 1403 (or corresponding interface circuitry, as discussed above). Display device 1403 may include any visual indicators, such as a heads-up display, a computer monitor, a projector, a touchscreen display, a liquid crystal display (LCD), a light-emitting diode display, or a flat panel display, for example.

Computing device 1400 may include an audio output device 1404 (or corresponding interface circuitry, as discussed above). Audio output device 1404 may include any device that generates an audible indicator, such as speakers, headsets, or earbuds, for example.

Computing device 1400 may include an audio input device 1410 (or corresponding interface circuitry, as discussed above). Audio input device 1410 may include any device that generates a signal representative of a sound, such as microphones, microphone arrays, or digital instruments (e.g., instruments having a musical instrument digital interface (MIDI) output).

Computing device 1400 may include a global positioning system (GPS) device 1409 (or corresponding interface circuitry, as discussed above). GPS device 1409 may be in communication with a satellite-based system and may receive a location of computing device 1400, as known in the art.

Computing device 1400 may include other output device 1405 (or corresponding interface circuitry, as discussed above). Examples of the other output device 1405 may include an audio codec, a video codec, a printer, a wired or wireless transmitter for providing information to other devices, or an additional storage device.

Computing device 1400 may include other input device 1411 (or corresponding interface circuitry, as discussed above). Examples of the other input device 1411 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 1400 may include a security interface device 1412. Security interface device 1412 may include any device that provides security measures for computing device 1400 such as intrusion detection, biometric validation, security encode or decode, access list management, malware detection, or spyware detection, Computing device 1400, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

The following embodiments pertain to further embodiments.

In one or more first embodiments, an apparatus comprises a multi-layer quantum well channel comprising a crystalline well layer between first and second crystalline barrier layers, the crystalline well layer comprising indium and arsenic, and each of the first and second crystalline barrier layers comprising indium, gallium, and arsenic, a source and a drain each lattice matched to the first crystalline barrier layer, the source and drain each comprising substantially pure crystalline indium and arsenide, and a gate structure between the source and the drain.

In one or more second embodiments, further to the first embodiments, the gate structure comprises a gate dielectric on the first crystalline barrier layer and a gate electrode on the gate dielectric, wherein the gate dielectric comprises hafnium and oxygen and has a thickness of not more than 8 nm.

In one or more third embodiments, further to the first or second embodiments, the apparatus further comprises a crystalline silicon substrate, wherein the second crystalline barrier layer is over and coupled to the crystalline silicon substrate.

In one or more fourth embodiments, further to the first through third embodiments, the apparatus further comprises a third crystalline barrier layer on the crystalline silicon substrate, wherein the third crystalline barrier layer comprises indium, aluminum, and arsenic, and wherein the second crystalline barrier layer is on and lattice matched to the third crystalline barrier layer.

In one or more fifth embodiments, further to the first through fourth embodiments, the third crystalline barrier layer comprises silicon doping.

In one or more sixth embodiments, further to the first through fifth embodiments, the second crystalline barrier layer is directly on the crystalline silicon substrate or an oxide layer on the crystalline silicon substrate.

In one or more seventh embodiments, further to the first through sixth embodiments, the apparatus further comprises a fin extending from the crystalline silicon substrate, and a second gate structure coupled to a channel region of the fin.

In one or more eighth embodiments, further to the first through seventh embodiments, the apparatus further comprises at least a portion of the fin is laterally adjacent the second crystalline barrier layer.

In one or more ninth embodiments, further to the first through eighth embodiments, the crystalline silicon substrate is between the fin and one of the source, drain, or gate structure.

In one or more tenth embodiments, further to the first through ninth embodiments, the apparatus further comprises a metal contact on the source or the drain, the metal contact comprising one of tungsten, tantalum, copper, ruthenium, or titanium.

In one or more eleventh embodiments, further to the first through tenth embodiments, the apparatus further comprises a cooling structure operable to remove heat from an IC die comprising the multi-layer quantum well channel to achieve an operating temperature at or below −25° C.

In one or more twelfth embodiments, a system comprises an integrated circuit (IC) die comprising a first transistor and a second transistor, each coupled to a silicon substrate, the first transistor comprising a multi-layer quantum well channel comprising a crystalline well layer between first and second crystalline barrier layers, the crystalline well layer comprising indium and arsenic and a first gate structure between a first source and a first drain, the first source and the first drain each lattice matched to the first crystalline barrier layer and each comprising substantially pure crystalline indium and arsenide, and the second transistor comprising a channel region comprising silicon and a second gate structure between a second source and a second drain, and a cooling structure operable to remove heat from the IC die to achieve an operating temperature at or below −25° C.

In one or more thirteenth embodiments, further to the twelfth embodiments, the first gate structure comprises a gate dielectric on the first crystalline barrier layer and a gate electrode on the gate dielectric, wherein the gate dielectric comprises hafnium and oxygen and has a thickness of not more than 8 nm.

In one or more fourteenth embodiments, further to the twelfth or thirteenth embodiments, the system further comprises a metal contact on the first source or the first drain, the metal contact comprising one of tungsten or tantalum.

In one or more fifteenth embodiments, further to the twelfth through fourteenth embodiments, the crystalline silicon substrate is between the fin and one of the source, drain, or gate structure, the IC die further comprising a plurality of first metallization layers over the crystalline silicon substrate and coupled to the first transistor, and a plurality of second metallization layers opposite the crystalline silicon substrate with respect to the first metallization layers and coupled to the second transistor.

In one or more sixteenth embodiments, further to the twelfth through fifteenth embodiments, the second transistor is a component of a constant current source module of a circuit and the first transistor is a pull down transistor of the circuit.

In one or more seventeenth embodiments, further to the twelfth through sixteenth embodiments, the circuit comprises one of a NOR gate circuit, a latch circuit, or an inverter circuit.

In one or more eighteenth embodiments, a method comprises forming a transistor on a buffer layer over a first substrate, the transistor comprising a multi-layer quantum well channel comprising a crystalline well layer between first and second crystalline barrier layers, and a first gate structure between a source and a drain, attaching a carrier wafer to a layer over the transistor, removing the first substrate and at least a portion of the buffer layer, and coupling the second crystalline barrier layer or a remaining portion of the buffer layer to a second substrate, the second substrate comprising crystalline silicon adjacent the second crystalline barrier layer or the remaining portion of the buffer layer.

In one or more nineteenth embodiments, further to the eighteenth embodiments, the method further comprises removing a portion of a multi-layer stack comprising the crystalline well layer, and the first and second crystalline barrier layers to expose a region of the crystalline silicon, and forming a second transistor on the exposed region, the second transistor comprising a silicon fin comprising a channel region, and a second gate structure between a second source and a second drain.

In one or more twentieth embodiments, further to the eighteenth or nineteenth embodiments, the method further comprises forming a plurality of metallization layers over the first and second transistors, the metallization layers coupling the first and second transistors.

In one or more twenty-first embodiments, further to the eighteenth through twentieth embodiments, the method further comprises thinning the second substrate opposite the first transistor to expose a region of the crystalline silicon opposite the first transistor, and forming a second transistor on the exposed region, the second transistor comprising a silicon fin comprising a channel region, and a second gate structure between a second source and a second drain.

In one or more twenty-second embodiments, further to the eighteenth through twenty-first embodiments, the method further comprises forming a plurality of first metallization layers over and coupled to the first transistor, and forming a plurality of second metallization layers over and coupled to the second transistor, the second metallization layers opposite the second substrate from the first metallization layers.

In one or more twenty-third embodiments, further to the eighteenth through twenty-second embodiments, the method further comprises forming a metal contact on the source or the drain, wherein the source and drain each comprise substantially pure crystalline indium and arsenide.

It will be recognized that the invention is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An apparatus, comprising:
a multi-layer quantum well channel comprising a crystalline well layer between first and second crystalline barrier layers, the crystalline well layer comprising indium and arsenic, and each of the first and second crystalline barrier layers comprising indium, gallium, and arsenic;
a source and a drain each lattice matched to the first crystalline barrier layer, the source and drain each comprising substantially pure crystalline indium arsenide; and
a gate structure between the source and the drain, wherein the gate structure comprises a gate dielectric on the first crystalline barrier layer and a gate electrode on the gate dielectric, wherein the gate dielectric comprises hafnium and oxygen and has a thickness of not more than 8 nm.

2. The apparatus of claim 1, further comprising:
a crystalline silicon substrate, wherein the second crystalline barrier layer is over and coupled to the crystalline silicon substrate; and
a third crystalline barrier layer on the crystalline silicon substrate, wherein the third crystalline barrier layer comprises indium, aluminum, and arsenic, and wherein the second crystalline barrier layer is on and lattice matched to the third crystalline barrier layer.

3. The apparatus of claim 2, wherein the third crystalline barrier layer comprises silicon doping.

4. The apparatus of claim 1, further comprising:
a crystalline silicon substrate, wherein the second crystalline barrier layer is directly on the crystalline silicon substrate or an oxide layer on the crystalline silicon substrate.

5. The apparatus of claim 1, further comprising:
a crystalline silicon substrate;
a fin extending from the crystalline silicon substrate; and
a second gate structure coupled to a channel region of the fin.

6. The apparatus of claim 5, wherein at least a portion of the fin is laterally adjacent the second crystalline barrier layer or the crystalline silicon substrate is between the fin and one of the source, drain, or gate structure.

7. The apparatus of claim 1, further comprising:
a metal contact on the source or the drain, the metal contact comprising one of tungsten, tantalum, copper, ruthenium, or titanium.

8. The apparatus of claim 1, further comprising:
a cooling structure operable to remove heat from an IC die comprising the multi-layer quantum well channel to achieve an operating temperature at or below −25° C.

9. A system, comprising:
an integrated circuit (IC) die comprising a first transistor and a second transistor, each coupled to a silicon substrate, the first transistor comprising:
a multi-layer quantum well channel comprising a crystalline well layer between first and second crystalline barrier layers, the crystalline well layer comprising indium and arsenic; and
a first gate structure between a first source and a first drain, the first source and the first drain each lattice matched to the first crystalline barrier layer and each comprising substantially pure crystalline indium arsenide, and
the second transistor comprising:
a channel region comprising silicon; and
a second gate structure between a second source and a second drain; and
a cooling structure operable to remove heat from the IC die to achieve an operating temperature at or below −25° C.

10. The system of claim 9, wherein the first gate structure comprises a gate dielectric on the first crystalline barrier layer and a gate electrode on the gate dielectric, wherein the gate dielectric comprises hafnium and oxygen and has a thickness of not more than 8 nm.

11. The system of claim 9, further comprising:
a metal contact on the first source or the first drain, the metal contact comprising one of tungsten or tantalum.

12. The system of claim 9, wherein the silicon substrate is between the channel region and one of the first source, the first drain, or the first gate structure, the IC die further comprising a plurality of first metallization layers over the silicon substrate and coupled to the first transistor, and a plurality of second metallization layers opposite the silicon substrate with respect to the first metallization layers and coupled to the second transistor.

13. The system of claim 9, wherein the second transistor is a component of a constant current source module of a circuit and the first transistor is a pull down transistor of the circuit.

14. The system of claim 13, wherein the circuit comprises one of a NOR gate circuit, a latch circuit, or an inverter circuit.

15. An apparatus, comprising:
a multi-layer quantum well channel comprising a crystalline well layer between first and second crystalline barrier layers, the crystalline well layer comprising indium and arsenic, and each of the first and second crystalline barrier layers comprising indium, gallium, and arsenic;
a source and a drain each lattice matched to the first crystalline barrier layer, the source and drain each comprising substantially pure crystalline indium arsenide;
a gate structure between the source and the drain; and
a cooling structure operable to remove heat from an IC die comprising the multi-layer quantum well channel to achieve an operating temperature at or below −25° C.

16. The apparatus of claim 15, further comprising:
a crystalline silicon substrate, wherein the second crystalline barrier layer is over and coupled to the crystalline silicon substrate; and
a third crystalline barrier layer on the crystalline silicon substrate, wherein the third crystalline barrier layer comprises indium, aluminum, and arsenic, and wherein the second crystalline barrier layer is on and lattice matched to the third crystalline barrier layer.

17. The apparatus of claim 16, wherein the third crystalline barrier layer comprises silicon doping.

18. The apparatus of claim 15, further comprising:
a crystalline silicon substrate, wherein the second crystalline barrier layer is directly on the crystalline silicon substrate or an oxide layer on the crystalline silicon substrate.

19. The apparatus of claim 15, further comprising:
a crystalline silicon substrate;
a fin extending from the crystalline silicon substrate; and
a second gate structure coupled to a channel region of the fin.

20. The apparatus of claim 19, wherein at least a portion of the fin is laterally adjacent the second crystalline barrier layer or the crystalline silicon substrate is between the fin and one of the source, drain, or gate structure.

21. The apparatus of claim 15, further comprising:
a metal contact on the source or the drain, the metal contact comprising one of tungsten, tantalum, copper, ruthenium, or titanium.

22. An apparatus, comprising:
a multi-layer quantum well channel comprising a crystalline well layer between first and second crystalline barrier layers, the crystalline well layer comprising indium and arsenic, and each of the first and second crystalline barrier layers comprising indium, gallium, and arsenic;

a source and a drain each lattice matched to the first crystalline barrier layer, the source and drain each comprising substantially pure crystalline indium arsenide;
a gate structure between the source and the drain;
a crystalline silicon substrate, wherein the second crystalline barrier layer is over and coupled to the crystalline silicon substrate;
a fin extending from the crystalline silicon substrate; and
a second gate structure coupled to a channel region of the fin.

23. The apparatus of claim 22, wherein the second crystalline barrier layer is directly on the crystalline silicon substrate, an oxide layer on the crystalline silicon substrate, or a third crystalline barrier layer on the crystalline silicon substrate.

24. The apparatus of claim 22, wherein at least a portion of the fin is laterally adjacent the second crystalline barrier layer or the crystalline silicon substrate is between the fin and one of the source, drain, or gate structure.

25. The apparatus of claim 22, further comprising:
a metal contact on the source or the drain, the metal contact comprising one of tungsten, tantalum, copper, ruthenium, or titanium.

* * * * *